(12) United States Patent
Padullaparthi

(10) Patent No.: US 10,008,826 B1
(45) Date of Patent: Jun. 26, 2018

(54) SURFACE-EMITTING SEMICONDUCTOR LASER

(71) Applicant: SAE Magnetics (H.K.) Ltd., Hong Kong (CN)

(72) Inventor: Babu Dayal Padullaparthi, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 322 days.

(21) Appl. No.: 14/701,978

(22) Filed: May 1, 2015

(51) Int. Cl.
| | |
|---|---|
| H01S 5/125 | (2006.01) |
| H01S 5/183 | (2006.01) |
| H01S 5/343 | (2006.01) |
| H01S 5/042 | (2006.01) |
| H01S 5/02 | (2006.01) |
| H01S 5/10 | (2006.01) |

(52) U.S. Cl.
CPC ........ *H01S 5/18377* (2013.01); *H01S 5/0206* (2013.01); *H01S 5/0421* (2013.01); *H01S 5/18369* (2013.01); *H01S 5/34313* (2013.01); *H01S 5/34353* (2013.01); *H01S 5/34386* (2013.01); *H01S 5/1042* (2013.01); *H01S 5/18311* (2013.01)

(58) Field of Classification Search
CPC .................................................. H01S 5/1042
USPC ....................................................... 313/309
See application file for complete search history.

(56) References Cited

U.S. PATENT DOCUMENTS

| | | | |
|---|---|---|---|
| 5,475,701 A * | 12/1995 | Hibbs-Brenner ... | H01S 5/18341 372/50.124 |
| 6,990,135 B2 | 1/2006 | Johnson et al. | |
| 7,912,105 B2 | 3/2011 | Maeda et al. | |
| 8,031,752 B1 | 10/2011 | Johnson et al. | |
| 8,755,422 B2 | 6/2014 | Shimizu et al. | |
| 9,014,225 B2 | 4/2015 | Padullaparthi | |
| 2006/0045162 A1* | 3/2006 | Johnson ................. | B82Y 20/00 372/99 |
| 2008/0002749 A1* | 1/2008 | Scherer ..................... | H01S 5/00 372/50.1 |
| 2008/0023688 A1* | 1/2008 | Johnson ................ | H01L 29/201 257/13 |
| 2015/0078410 A1 | 3/2015 | Padullaparthi | |

OTHER PUBLICATIONS

U.S. Appl. No. 14/319,251, filed Jun. 30, 2014, Padullaparthi.
U.S. Appl. No. 14/600,443, filed Jan. 20, 2014, Padullaparthi.
U.S. Appl. No. 14/678,414, filed Apr. 3, 2015, Padullaparthi.

* cited by examiner

*Primary Examiner* — Christopher Raabe
(74) *Attorney, Agent, or Firm* — Nixon & Vanderhye PC

(57) ABSTRACT

Certain examples described herein relate to a surface-emitting semiconductor-laser which includes an oxide window, a light emitting cavity, and at least one phase matching window. The oxide window, the light emitting cavity, and the at least one phase matching layer are arranged so that a predetermined phase relationship is satisfied. The phase relationship facilitates high performance and stable multimode operations of the surface-emitting semiconductor laser designed to emit between 850-1060 nm wavelength for applications such as long distance optical communications in high performance computing and data servers.

22 Claims, 23 Drawing Sheets

| Design No. | | TYPE A | TYPE B | TYPE C |
|---|---|---|---|---|
| Phase-shift design Upper-layer / Lower-layer | | (Phase-mismatching) 0λ / 0λ | (Phase-mismatching) 0λ / +0.04λ | (Phase-matching) -0.04λ / +0.04λ |
| [E(z)-node]-[Ox-center] mismatch | Distance (nm) | 11.52 | 7.28 | 0.76 |
| | Wave magnitude (xλ) | 0.0406λ | 0.0254λ | 0.00268λ |
| $\Delta N_{eff}$ | | 0.0118 | 0.00792 | 0.00493 |
| Normalized frequency: V (@Ox=7.5μm) | | 7.71 | 6.27 | 4.97 |
| Lateral-mode quantity | | 10 | 6 | 4 |

FIG. 7

| Section | Section name | Optical Distance at Emission Wavelength (um) | | | | | | | |
|---|---|---|---|---|---|---|---|---|---|
| | | Type-A | | Type-B | | Type-C | | | |
| | | Individual | Total | Individual | Total | Individual | Total | | |
| 116+117 | OXW L1-L4 | 0.50λ | 1.75λ | 0.50λ | 1.75λ | 0.46λ | 1.75λ | | |
| 115 | Optical Cavity | 1.00λ | | 1.00λ | | 1.00λ | | | |
| 114 | PML L1-L2 | 0.25λ | | 0.29λ | | 0.29λ | | | |
| Cal. | $\Delta N_{eff}$ | 0.0118 | | 0.00792 | | 0.00493 | | | |
| Experimental findings | Beam Divergence (deg.) | ≈ 35 | | ≈ 28 | | ≈ 22 ± 3 | | | |
| | M2 (beam quality) @ fixed PMID=8.25um | ≈ 4.8 | | ≈ 3.59 | | ≈ 2.96 | | | |
| | Spectral RMS Line width (nm) | ≈ 0.6-0.8 | | ≈ 0.4-0.6 | | ≈ 0.2-0.4 | | | |

FIG. 9

SURFACE-EMITTING SEMICONDUCTOR LASER

TECHNICAL FIELD

Certain example embodiments described herein relate to surface-emitting semiconductor laser elements and the like, and methods for manufacturing such elements.

BACKGROUND AND SUMMARY OF CERTAIN EXAMPLE EMBODIMENTS

Surface-emitting laser elements (or vertical cavity surface-emitting laser elements—VCSELs) are characterized in that laser light can be emitted in a perpendicular direction to the principal surface of a substrate formed with the element and in that the element has low threshold current and high power conversion efficiency. In addition, surface-emitting laser elements have various advantages, for example, that they emit circular light whose cross-section perpendicular to the optical axis is circular, that two-dimensional arrangement of them is facilitated, and that on-wafer inspection of them can be carried out efficiently. A VCSEL is suitable for use as the light source in various consumer applications, for example, an image forming apparatus, an optical pickup device, the optical communication data transmitter of optical interconnections and optical modules, etc. Optical modules made with VCSELs also have applications in high-speed transmission of light. At least in part due to such advantages, it is expected that the demand for surface-emitting laser elements as light sources for high-speed data communications will increase in the future.

In using a surface-emitting laser element for a light source for data communications, it generally is desirable for the element to have a structure capable of operating at high speed. In order for the surface-emitting laser element to accomplish a high-speed operation 10-40 Gbit/s and above, for example, it is especially desirable to optimize or otherwise improve characteristics such as low beam divergence, narrow laser line width, low junction temperature, and/or the like. Thus, it is desirable to provide a semiconductor light-emitting element that reduces one or more of beam divergence, narrow laser line width, and low junction temperature.

Certain example embodiments, as described below, help address these and/or other aspects. According to one example embodiment, a surface-emitting laser comprises a top mirror and a bottom mirror, at least one oxide section formed between the top and bottom mirrors, a light emitting cavity region formed between the oxide section and the bottom mirror, and a phase matching section with a graded index layer made of semiconductor thin films such that the total length of the oxide section, the light emitting cavity region and the phase matching section is 1.75 times an emitting wavelength of the surface-emitting laser, and the distance from center of the quantum wells to the center of the oxide layer being 0.75 times the emitting wavelength. The top mirror and the bottom mirror are each made with multilayers of semiconductor thin films with alternative indices of refraction. The at least one oxide section is formed between the top and bottom mirrors and comprises a stacked plurality of layers of semiconductor thin film of which at least one semiconductor thin film layer is provided as an oxide layer having an aluminum content of at least 98%. The light emitting cavity region, has a plurality of quantum wells and a plurality of barrier layers formed from semiconductor thin film with the quantum wells including $In_xGaAs$ where $x=0-1$ and the barriers including either $Al_xGaAs$ barriers where $x=0-0.4$ or $GaAs_{1-y}P_y$ where $y=0.2-0.3$.

Layers of the oxide section and the phase matching section may be adjusted such that the $1/e2$ width of beam divergence value is between 15-26 degrees, and such that the spectral RMS line width value be less than 0.45 nm. A layer in the oxide section above the oxide layer may be a graded composition layer with high aluminum content above 98% and a thin layer in the oxide section below the oxide layer may include $Al_{0.9}GaAs$, the oxide layer may include high aluminum content above 98% and may be p-doped at $2.5 \times 10^{18}$ cm$^{-3}$, and the bottom mirror may include alternating refractive index layers made from $Al_xGaAs$ where $x=0.12$ & $0.9-1$ for 850 nm wavelength and with $x=0$ & 1 for 1060 nm wavelength.

An aperture in the oxide layer may be configured such that $H_{Edge} \leq 3 \times H_{tip}$, where $H_{Edge}$ is a height of the oxide layer at an edge furthest from the aperture, and $H_{tip}$ is a height of the oxide layer closest to the aperture.

The aperture may be configured such that $W_{AlAs} \leq W_{AlOx}$, where the aperture provides an opening of length WAR, in the oxide layer, and the oxide layer extends for a length $W_{AlOx}$ on either side of the aperture.

A substrate of the surface-emitting laser may comprise n-doped, p-doped, or un-doped GaAs.

The substrate may be oriented 2 degrees-off axis along a selected plane.

In the layer above the at least one oxide layer in the oxide section, a linear grading may be used for the aluminum content Al(x), where x ranges from 1.0 to 0.15 from start to end of the layer.

The top mirror may be either linearly doped or modulation doped.

The top contact layer comprising p$^{++}$ GaAs may be provided above and adjacent to the top mirror, and the top contact layer may be terminated either as in-phase or anti-phase and may include a surface relief structure to control photon lifetime for achieving higher bandwidths.

The top mirror may include three to four $Al_xGaAs$ layers with aluminum content at 96%.

The at least one oxide section may comprise a first oxide layer and a second oxide layer, both having aluminum content at 98% or greater, at an optical distance of $0.5\lambda$ from each other.

A first oxide layer and a second oxide layer may be located above and below, respectively, of the multiple quantum well gain region, and a graded spacer layer may be adjusted such that the optical cavity is at its shortest cavity length of $0.5\lambda$.

Another example embodiment provides a method for forming a surface-emitting laser using an epitaxial process. The method includes providing a top mirror and a bottom mirror, providing at least one oxide section formed between the top and bottom mirrors, providing a light emitting cavity region formed between the oxide section and the bottom mirror, and providing a phase matching section with a graded index layer made of semiconductor thin films, such that a total length of the oxide section, the light emitting cavity region and the phase matching section is 1.75 times an emitting wavelength of the surface-emitting laser, and the distance from center of the quantum wells to the center of the oxide layer is 0.75 times the emitting wavelength.

The top mirror and the bottom mirror may each be made with multilayers of semiconductor thin films with alternative indices of refraction. The at least one oxide section, formed between the top and bottom mirrors, comprises a stacked plurality of layers of semiconductor thin film of which at least one semiconductor thin film layer is provided as an oxide layer having an aluminum content of at least 98%. The light emitting cavity region formed between the oxide section and the bottom mirror may have a plurality of quantum wells and a plurality of barrier layers formed from semiconductor thin film with the quantum wells including $In_xGaAs$ where x=0-1 and the barriers including either $Al_xGaAs$ barriers where x=0-0.4 or $GaAs_{1-y}P_y$ where y=0.2-0.3. Layers of the oxide section and the phase matching section may be adjusted such that the 1/e2 width of beam divergence value is between 15-26 degrees, and such that the spectral RMS line width value be less than 0.45 nm. A layer in the oxide section above the oxide layer may be a graded composition layer with high aluminum content above 98% and a thin layer in the oxide section below the oxide layer may include $Al_{0.9}GaAs$. The oxide layer include high aluminum content above 98% and is p-doped at $2.5\times10^{18}$ cm$^{-3}$. The bottom mirror includes alternating refractive index layers made from $Al_xGaAs$ where x=0.12 & 0.9-1 for 850 nm wavelength and with x=0 & 1 for 1060 nm wavelength.

Another example embodiment provides a surface-emitting laser comprising a top mirror and a bottom mirror, each comprising a stacked plurality of layers of semiconductor thin film having alternating indices of refraction; at least one oxide section, formed between the top and bottom mirrors, comprising a stacked plurality of layers of semiconductor thin film of which at least one semiconductor thin film layer is provided as an oxide layer having a high aluminum content; a light emitting cavity region, formed between the oxide section and the bottom mirror, having a plurality of quantum wells and a plurality of barrier layers formed from semiconductor thin film; and at least one phase matching section having a graded index layer of semiconductor thin film. The composition and a dimension of one or more of the oxide section, the light emitting cavity region, and the at least one phase matching section are determined such that a predetermined phase relationship for reducing an effective refractive index difference between core and clad of the surface emitting laser is satisfied among the oxide section, the light emitting cavity region, and the at least one phase matching section.

The total length from the top end of the oxide layer to the bottom end of the phase matching layer may be determined so as to correspond to a first value equal to an emitting wavelength multiplied by a first constant, and the total length of the light emitting region is determined so as to correspond to a second value equal to the emitting wavelength multiplied by a second constant. The first constant can be 1.75 and the second constant can be 1.0.

The distance between the center of the plurality of quantum wells to a center of the oxide layer may be substantially equal to 0.75 times the emitting wavelength.

The oxide section and the at least one phase matching section may be adjusted such that the 1/e2 width of beam divergence value is between 15-26 degrees.

The oxide section and the at least one phase matching section may be determined such that a corresponding spectral RMS line width value is less than 0.45 nm.

A graded composition layer may be arranged above the oxide layer and a thin layer of $Al_{0.9}GaAs$ may be arranged below the oxide layer.

The oxide layer may be p-doped at 2.5×1018 cm$^{-3}$.

The light emitting cavity region may include three $In_xGaAs$ quantum wells where x=0, or five $In_xGaAs$ quantum wells, where x=0.05-0.3 at between 850-1060 nm emission wavelength.

The bottom mirror may include alternating refractive index layers including $Al_xGaAs$ where x=0.12 and 0.9-1 for 850 nm emitting wavelength or with x=0 and 1 for 1060 nm emitting wavelength.

These aspects, features, and example embodiments may be used separately and/or applied in various combinations to achieve yet further embodiments of this invention.

BRIEF DESCRIPTION OF THE DRAWINGS

These and other features and advantages may be better and more completely understood by reference to the following detailed description of exemplary illustrative embodiments in conjunction with the drawings, of which:

FIG. 7 provides a summary of some calculated results related to the light-emitting elements of types A, B, and C, illustrated in FIGS. 5A-C and 6A-C;

FIG. 9 provides certain design parameters and experimental results for cavity phase shift in 850 nm VCSEL epitaxial layer structures such as those illustrated in FIGS. 5A-C and 6A-C;

DETAILED DESCRIPTION OF CERTAIN EXAMPLE EMBODIMENTS

Certain example embodiments described herein relate to surface-emitting semiconductor laser elements (e.g., VCSELs) and the like, and methods for manufacturing such elements.

The inventor recognized that the effective refractive index difference between core and clad of a semiconductor laser in the Cylindrical Step Waveguide model is a key design parameter that can affect transverse mode control through controlling parameters such as lateral mode quantity, beam divergence (represented by the far field pattern or FFP), RMS spectral width, and junction temperature. The inventor identified certain phase relationships between the oxide window, light emitting cavity (or VCSEL cavity), and at least one phase matching layer of a surface-emitting semiconductor laser in order to facilitate and improve high performance (e.g., narrow FFP and line width (LW)) and stable multimode operation of that surface-emitting semiconductor laser designed to emit between 850-1060 nm wavelength that can be used, for example, for long distance optical communications in high performance computing and data servers. By the epitaxial structure of the surface-emitting semiconductor, laser effects such as reducing the spectral line width of VCSEL device, changing of the reflectivity of the modes, and controlling of the lifetime of photons can be achieved, e.g., such that signal transmission to longer distances is substantially aided.

Figure 1:
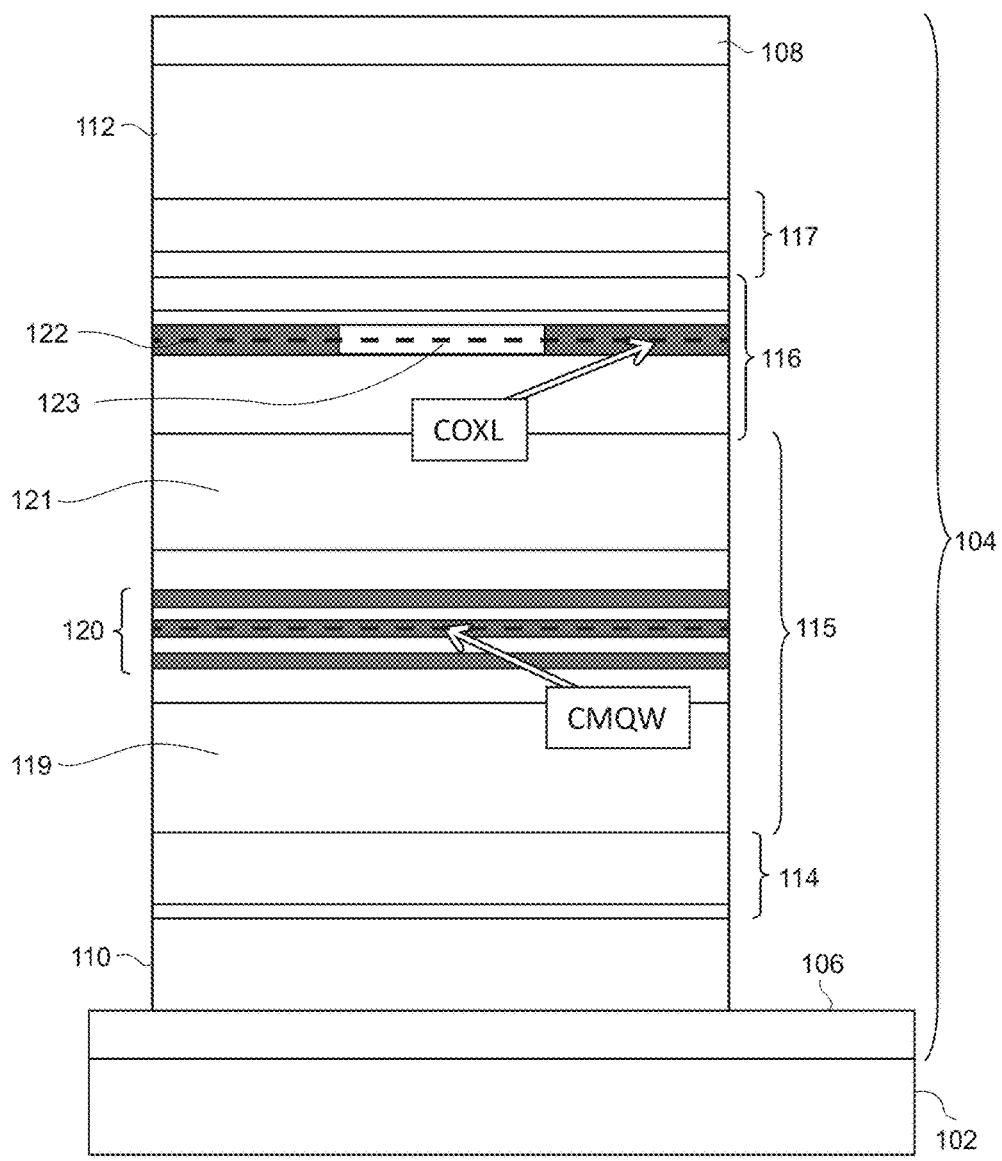
FIG. 1 is a cross-sectional view of the structure of a semiconductor light-emitting element according to certain example embodiments of the invention.

FIG. 1 is a schematic cross-sectional view of the structure of a surface-emitting semiconductor element (also sometimes referred to herein as a surface-emitting laser) 100 according to certain example embodiments of the invention. The surface-emitting semiconductor element 100 includes a substrate 102 and a multilayer structure 104 formed on the substrate 102. In certain example embodiments, the semiconductor thin films and layers described herein are sequentially formed by epitaxial crystal growth in the order from bottom to top, as illustrated in FIG. 1. A technique such as, but not limited to, Metal Organic Chemical Vapor Deposition (MOCVD) may be used in forming element 100. The multilayer structure 104 includes a bottom contact 106 formed adjacent to and on the substrate 102, and a top contact 108 at the top of the structure 104. A bottom mirror 110 and a top mirror 112 are formed adjacent to the bottom contact 106 and top contact 108, respectively. According to certain example embodiments, the top mirror 112 and the bottom mirror 110 are semiconductor multilayer reflector mirrors of the Distributed Bragg Reflector (DBR) variety. The bottom mirror 110 and the top mirror 112 are configured to have opposite polarities from each other. In the present embodiment, the bottom mirror 110 is an n-type reflector and the top mirror 112 is a p-type reflector. Each of the bottom and top mirrors 110 and 112 includes a stack of semiconductor thin film layers in different refractive index layers, alternately stacked. The layers of the bottom and top mirrors can be made with materials such as aluminum arsenide (AlAs), gallium arsenide (GaAs), or aluminum gallium arsenide (AlGaAs), e.g., having different mole fractions of aluminum and gallium. In some implementations, each of mirrors 110 and 112 may include many layers such as twenty or thirty pairs of layers, or more.

In the present embodiments, the bottom mirror 110 is an $n^+$ GaAs buffer, for example, an n-doped bottom-DBR including $Al_{0.15}Ga_{0.85}As/Al_{0.9}Ga_{0.1}As$. The bottom mirror 110 may include alternating (e.g., high and low valued) refractive index layers including $Al_xGaAs$ where x=0.12 and 0.9-1 for 850 nm emitting wavelength or with x=0 and 1 for 1060 nm emitting wavelength. The top mirror is typically either linearly doped or modulation doped. The top mirror 112 may be a $p^{++}$ GaAs contact layer, for example, a p-doped top DBR including $Al_{0.15}Ga_{0.85}As/Al_{0.9}Ga_{0.1}As$. The top mirror may include three to four $Al_xGaAs$ layers with aluminum content at 96% or greater.

Sandwiched between the top and bottom mirrors 112 and 110, in order from the bottom mirror 110 to the top mirror 112, are a bottom phase-matching section 114, a VCSEL cavity (also sometimes referred to as the active region) 115, an oxide section 116, and a top phase-matching section 117.

The phase matching sections 114 and 117 are each made of a stack of semiconductor thin films. In certain example embodiments, each phase matching section includes at least one graded index layer, where the aluminum content of the layer is changed from bottom to top of that layer in accordance with a predetermined grading.

The VCSEL cavity 115 includes layers 119 and 121 of SCH/Grin SCH sandwiching a light emitting layer 120. The light emitting layer 120 includes one or more quantum wells and barriers. The one or more quantum wells may comprise Gallium Arsenide (GaAs), Aluminum Arsenide (AlAs), Aluminum Gallium Arsenide (AlGaAs), or Indium Aluminum Gallium Arsenide (InAlGaAs). The one or more barrier layers may comprise Gallium Arsenide (GaAs), Aluminum Gallium Arsenide (AlGaAs), or Gallium Arsenide Phosphide (GaAsP) to create electrical and optical confinement of injected carriers and emitted photons. The light emitting layer 120 is configured to generate light having a predetermined wavelength. In certain example embodiments, a predetermined emission wavelength for which layer 120 is configured may be a wavelength between 850 nm and 1060 nm, for example, 850 nm, 980 nm, or 1060 nm. When a current is applied to the surface-emitting semiconductor element 100, which then flows through the active region 115, photons are generated by the quantum wells of the light emitting layer 120. The generated light is amplified by being reflected back and forth between the mirrors 110 and 112, and subsequently a portion of the amplified light is emitted (e.g., vertically emitted) through the top mirror 112 and out of a contact window (not shown) at the top of element 100. According to certain example embodiments, the active region 115 includes (or more specifically, the light emitting layer 120 includes) three $In_xGaAs$ quantum wells where x=0, or five $In_xGaAs$ quantum wells where x=0.05-0.3 at between 850-1060 nm emission wavelength. For lower speeds up to 10 Gb/s and 850 nm emission, 3 $In_xGaAs$ (x=0) quantum wells can give sufficient optical gain and for higher speeds up to or larger than 25 Gb/s and 850 nm emission, 5 $In_xGaAs$ (x=0.1) quantum wells may be required in order to achieve sufficient optical gain. In the case of 1060 nm emission for reaching 25 Gb/s, 3 $In_xGaAs$ (x=0.26) quantum wells can be used to obtain sufficient optical gain.

The oxide section 116 comprises a stack of semiconductor thin films including at least one oxide layer (also sometimes referred to as a current limiting layer) 122. The oxide layer is configured such that an aperture (or window) 123 of circular or substantially circular shape is created in the center region of the oxide layer. In some other embodiments, aperture 123 may have a shape different from a circular shape. The oxide layer 122 functions to direct the electrical current generally toward the center of the light emitting layer 120. When used, the oxide layer 122 insulates all but the circular-shaped window 123. Because most of the electrical current is directed toward the center of the light emitting layer 120, most of the light is generated within the center portion of the active layer 120. The stack of semiconductor thin films in the oxide section 116 may include one or more phase matching layers.

In the embodiment being described, the substrate 102 comprises n-doped GaAs. However, it will be appreciated that the present invention is not limited thereto, and may include p-doped, n-doped, or un-doped materials (e.g., p-doped or n-doped silicon, or un-doped GaAs) formed beneath the bottom mirror 110. In certain example embodiments, the substrate 102 may be oriented 2 degrees-off axis along a selected plane.

In certain example embodiments, a top contact layer, such as layer 108, comprising $p^{++}$ GaAs is provided above and adjacent to the top mirror 112. The top contact layer 108 or a top contact layer stack that may include an AlGaAs graded index layer, may be terminated either as in-phase or antiphase and may include a surface relief (SR) structure to control photon lifetime for achieving higher bandwidths. Etching of top surface down to certain depths, for example 20 or 40 nm, can create reflectivity change for fundamental and higher order modes. Thus SR creates phase discrimination for transverse optical modes, that leads to reduced life time for photons and it enhances relaxation bandwidth at the expense of slight increase in threshold current. Erik Haglund et al., "Reducing the spectral width of high speed oxide confined VCSELs using an integrated mode filter". Proc. of SPIE Vol. 8276, pp. 8276L-1-L-8, the contents of which is hereby incorporated by reference in its entirety, describes aspects of SR. Moreover, US Patent Application Publication No. 2015/0078410, which is hereby incorporated by reference in its entirety, describes SR structures The dimensions of various sections/layers of the epitaxial structure for the semiconductor element 100 and/or the composition thereof are determined such that a phase relationship involving the oxide section, the light emitting cavity region, and the at least one phase matching section satisfies a predetermined phase relationship among the arranged the oxide section, the light emitting cavity region, and the at least one phase matching section.

Figure 2:
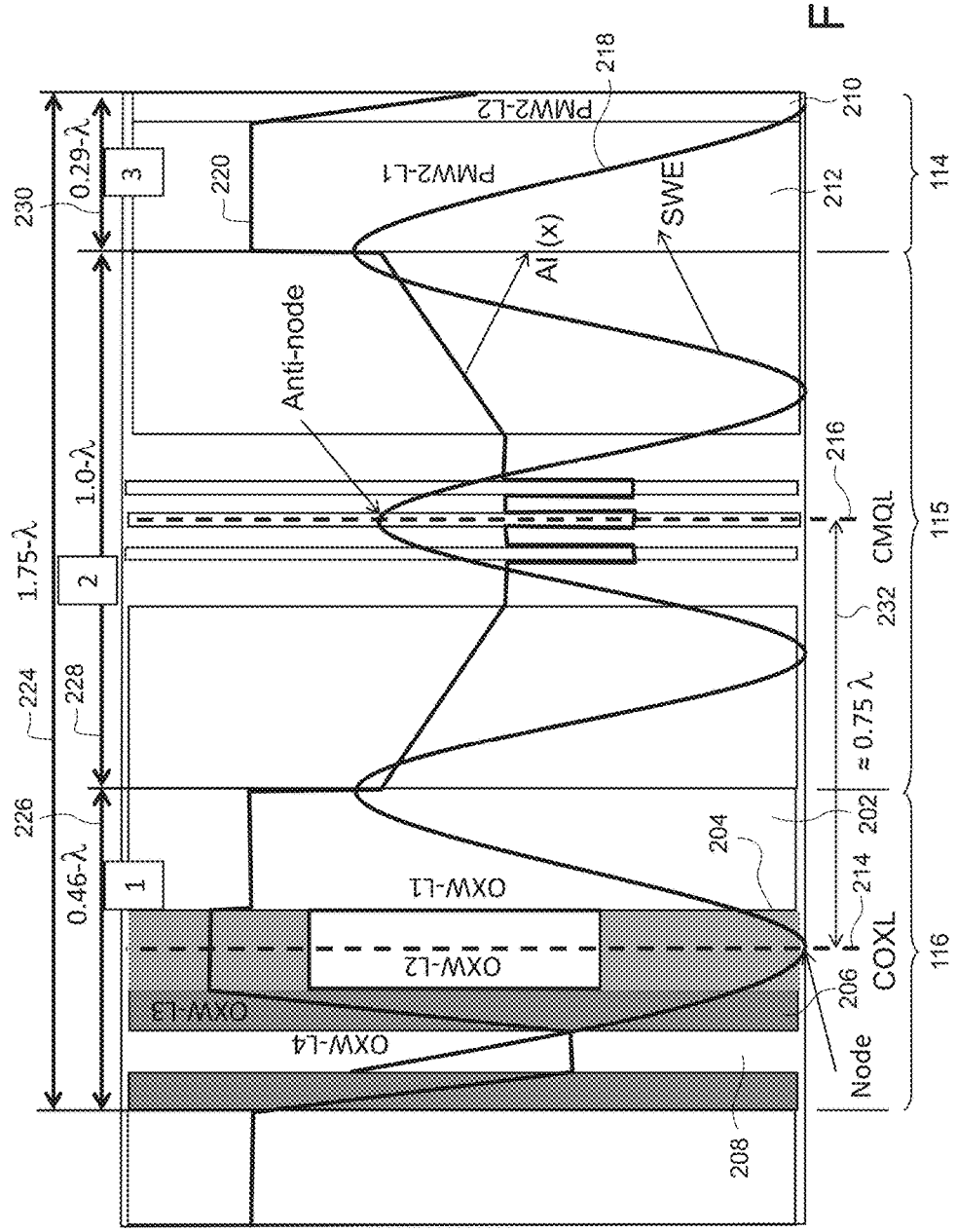
FIG. 2 is a close-up of a portion of the cross-sectional view of FIG. 1, according to certain example embodiments of the invention.

FIG. 2 provides a schematic close-up view of a portion of the surface-emitting laser 100, and illustrates the design of the surface-emitting laser 100 with respect to the corresponding standing wave electric field (SWE) and the Al content Al(x). FIG. 2 illustrates multiple semiconductor thin film layers 202-208 of the oxide section 116, and also the semiconductor thin film layers 210-212 that make up the bottom phase matching section 114. The oxide section 116, comprises the oxide layer 204 (shown as OXW-L2) sandwiched between semiconductor thin films 202 and 206 (shown as OXW-L1 and OXW-L2, respectively, with semiconductor thin film 202 being formed adjacent to one end of the VCSEL cavity 115. Layer 212 (shown as PMW2-L1) of the bottom phase matching section 114 is formed adjacent to the other end of the VCSEL cavity 115.

FIG. 2 also illustrates the distribution of a standing wave electric field 218 in some parts of the surface-emitting semiconductor element 100. The oxide section 116, the VCSEL cavity 115, and the bottom phase match section 114 are configured such that the phase relationship indicated by the standing wave electric field 218 as shown is obtained. The said phase relationship is directed to reduce the effective refractive index difference between the core and clad of the surface-emitting laser. As shown, a node and an antinode of the standing wave electric field 218 are at, respectively, a location 214 (e.g., midway between the 202 and 206 layers) in the oxide layer 204 and a location 216 in the VCSEL cavity 115. Also, a node is located at the boundary of the bottom phase matching section 114 with the bottom mirror 110, and an antinode is located at the boundary of the oxide section 116 with the top phase matching section 118. Further antinodes are obtained at either end (e.g., at the top and bottom) of the VCSEL cavity 115.

Additionally, FIG. 2 also illustrates the distribution 220 of Al(x) mole fractions in the surface-emitting semiconductor element 100. The Al(x) content is higher in the areas immediately adjacent to the VCSEL cavity 115 than within the VCSEL cavity 115. Within the VCSEL cavity, in the light emitting layer 120, Al(x) content is least in the quantum wells, as seen with respect to the three quantum wells in the light emitting layer 120.

In order to achieve the desired phase relationship, in the illustrated embodiment, the oxide section 116, the VCSEL cavity 115 and the bottom phase matching layer 114 are configured such that the distance 224 from the lower end of (e.g., the end adjacent to the bottom mirror 110) the bottom phase matching layer 114 to the upper end of the oxide layer, OXW L4 208 is a predetermined factor, in this example 1.75, times the emission wavelength (e.g., 1.75λ). In order to achieve the desired distance 224, the distance 226 from the top end of the oxide layer 208 to the lower end of the oxide section 116 is 0.46λ, the distance 228 from the top of the VCSEL cavity 115 to the bottom of the VCSEL cavity 115 is 1.0λ, and the distance 230 from the top end to the lower end of the bottom phase matching layer is 0.29λ. In addition the distance 232 from the midpoint 214 of the oxide layer 204 to the midpoint 216 of the VCSEL cavity 115 is exactly, or very close to, 0.75λ.

The oxide section 116 and the bottom phase matching section 114 can be adjusted such that the $1/e^2$ width of beam divergence value is between 15-26 degrees, and/or such that such that a corresponding spectral RMS line width value is less than 0.45 nm.

The oxide section 116 includes a graded composition layer above the oxide layer and a thin layer of $Al_{0.9}GaAs$ below the oxide layer. A linear grading may be used for the aluminum content Al(x) in layer 206 above the oxide layer 204, wherein x ranges from 1.0 to 0.15 from start to end of the layer. The oxide layer can be p-doped at $2.5 \times 10^{18}$ $cm^{-3}$.

Figure 3:
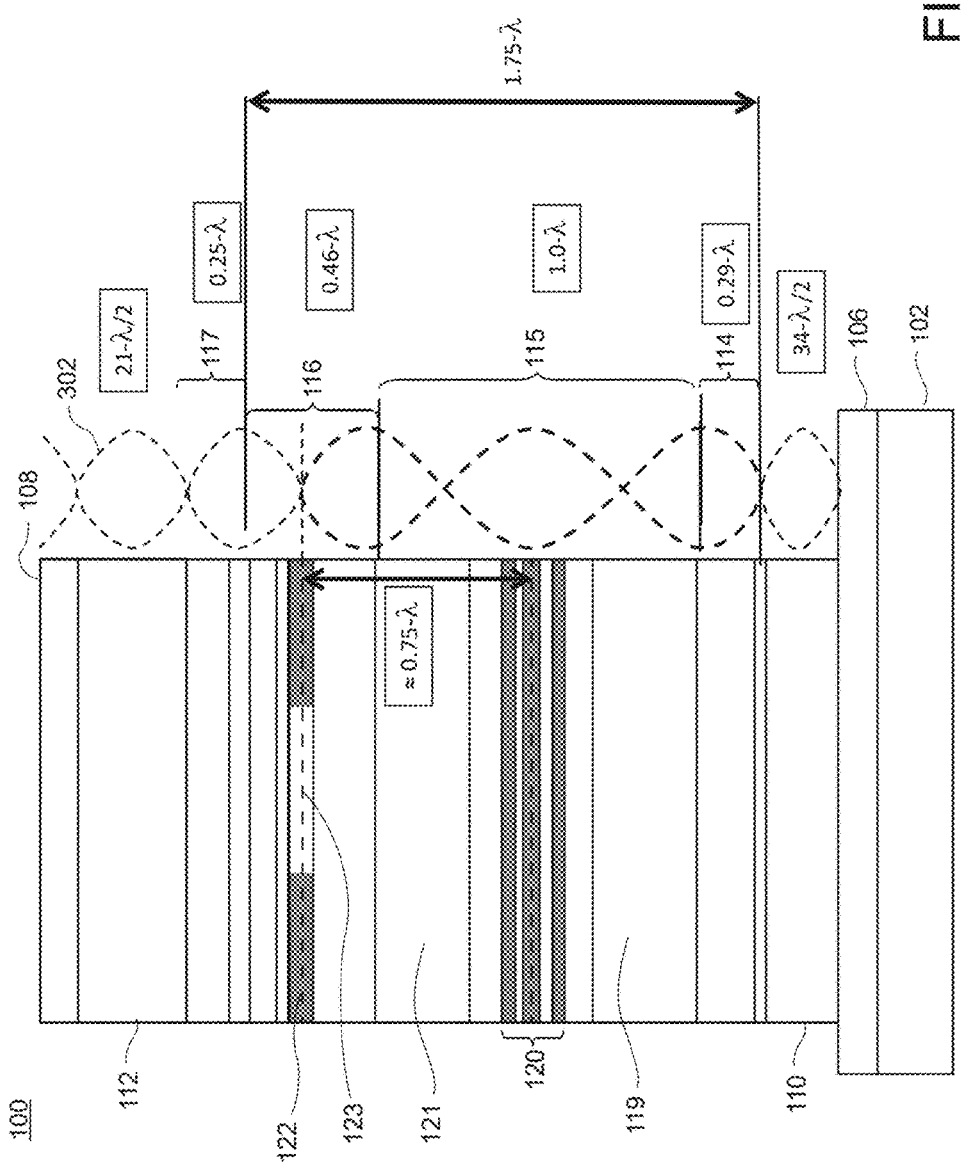
FIG. 3 illustrates the semiconductor light-emitting element shown in FIG. 1 alongside a superimposed corresponding standing wave electric field and distances associated with some of the semiconductor thin film layers.

FIG. 3 illustrates the surface-emitting laser 100 alongside a corresponding standing wave electric field 302. In the embodiment illustrated, the configuration of several distances is illustrated. In addition to the distances described in relation to FIG. 2, the top mirror has a distance of $21\lambda/2$, the bottom mirror a distance $34\lambda/2$, and the upper phase matching section a distance $0.25\lambda$. In an example embodiment, the standing wave electric field 302 locates an antinode (or a node) at the center of multiple quantum wells, and corresponding nodes (or antinodes) at either end of the cavity 115.

Figure 4:
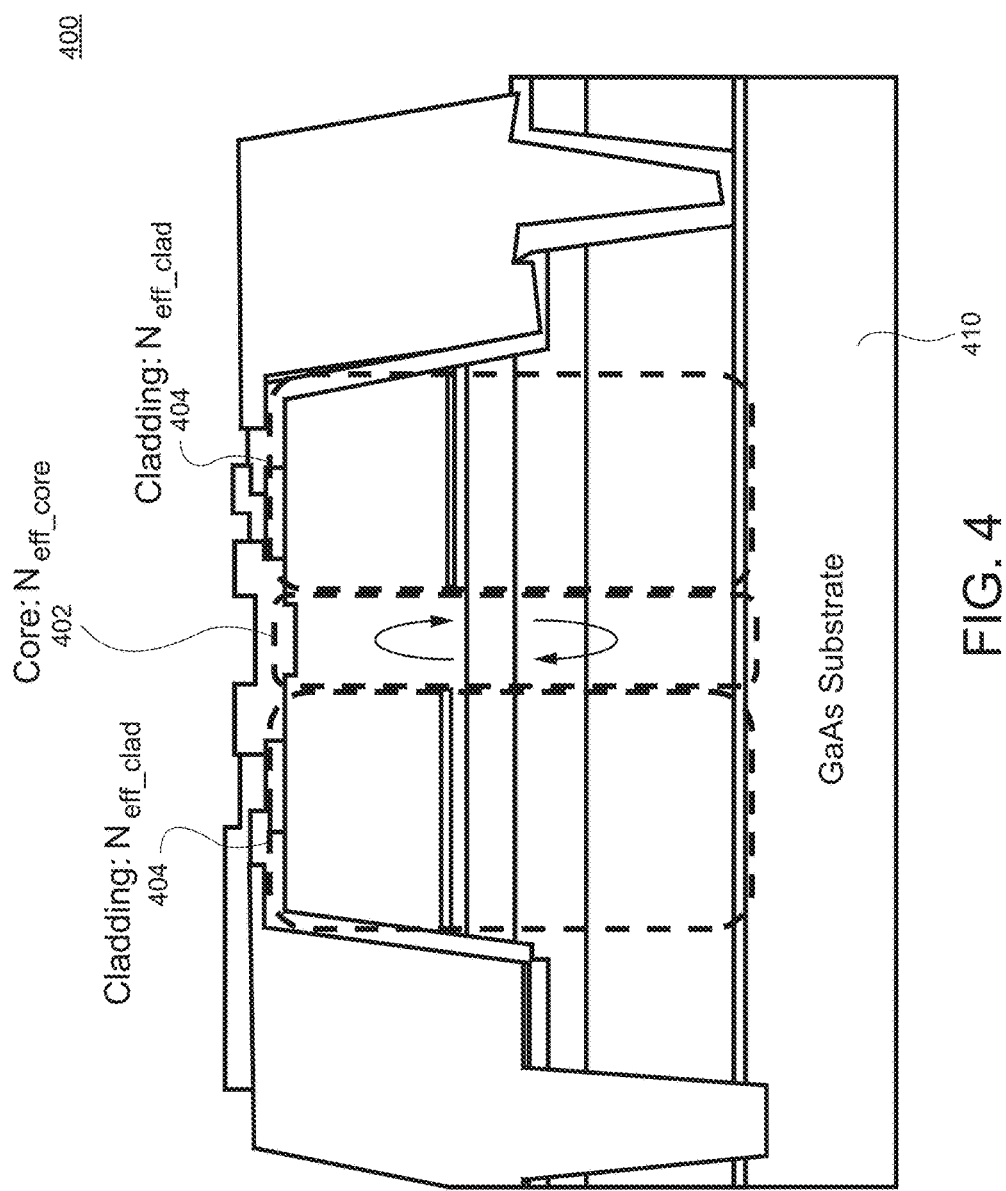
FIG. 4 illustrates a schematic model of a semiconductor light-emitting element according to an embodiment that can be used for determining the effective refractive index.

FIG. 4 is a schematic view 400 of a surface-emitting semiconductor element 400 according to some embodiments that may be used in determining the effective refractive index $N_{eff}$ of its VCSEL cavity. The core 402 and cladding 404 is schematically illustrated in FIG. 4. The surface-emitting semiconductor element 400 may comprise a thin film layer structure as shown in FIG. 1 formed on a substrate 410 of GaAs. After wet oxidation of AlAs layer 122, the high refractive index layer 122 converts into low refractive index Al2Ox layer 122, leaving behind a high refractive index layer 123 at the aperture region. This creates a lateral refractive index step and is responsible for net index changes in core and clad regions in cylindrical geometry shown, for example, in surface-emitting semiconductor element 400.

The equivalent refractive index of the VCSEL cavity can be calculated by:

$$N_{eff} \stackrel{def}{=} \frac{\int dz N(z) |E(z)|^2}{\int dz |E(z)|^2}$$

The $N_{eff}$ difference between the core and clad can be calculated by:

$$\Delta N_{eff} \stackrel{def}{=}$$

$$N_{eff_{core}} - N_{eff_{clad}} = \frac{(N_{AlAs} - N_{Al_2O_3}) \int_{Ox\_layer} dz |E(z)|^2}{\int dz |E(z)|^2} \int_{Ox\_layer} dz |E(z)|^2$$

The above is equivalent to the optical-confinement factor of the oxide layer in a surface-emitting semiconductor element such as element 100 described in relation to FIG. 1.

Figure 5A:
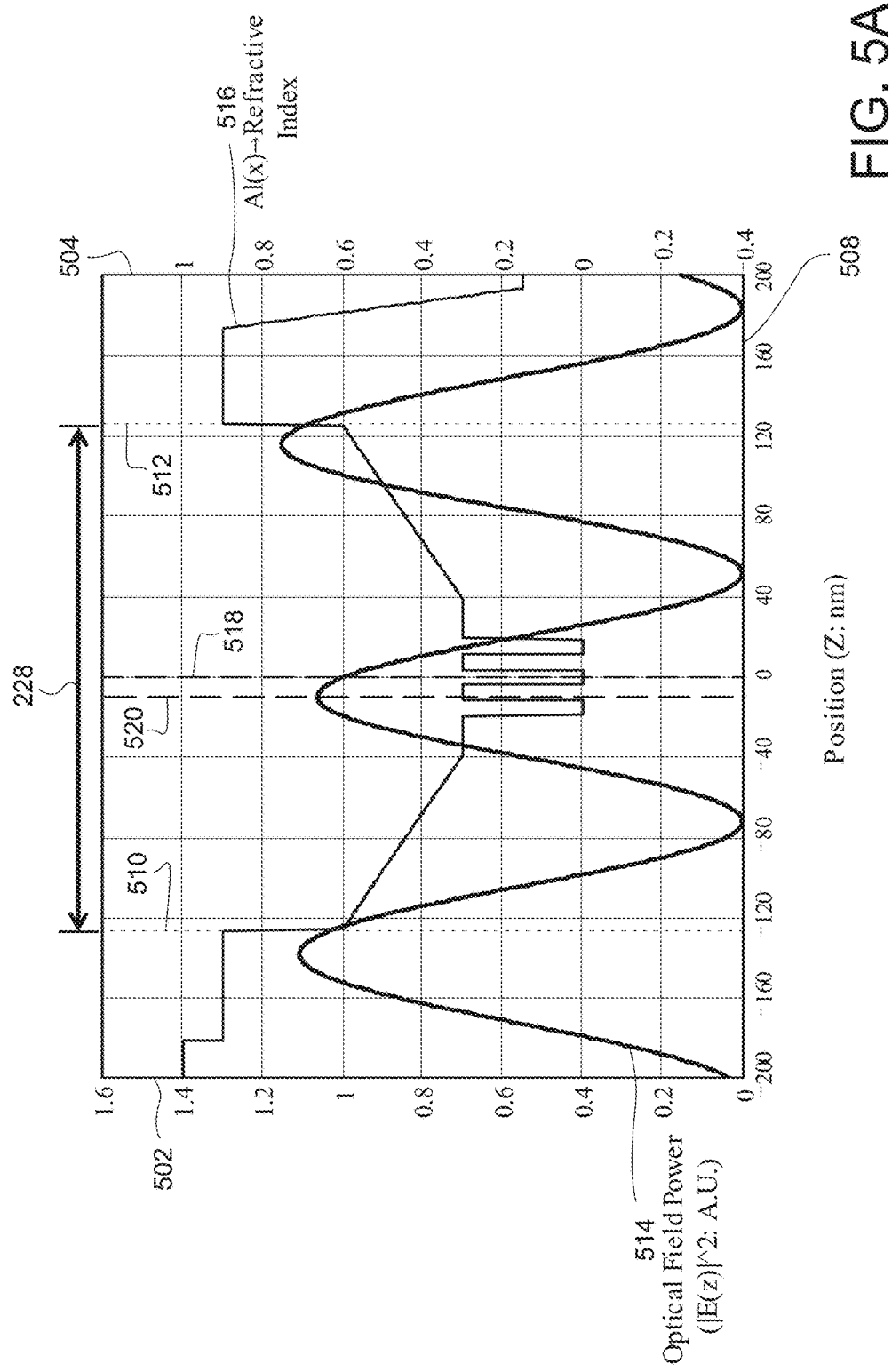
FIG. 5A illustrates electric field center and oxide node positions shown in relation to a center of multiple quantum wells in a semiconductor light-emitting element of type A, according to some embodiments.
Figure 5B:
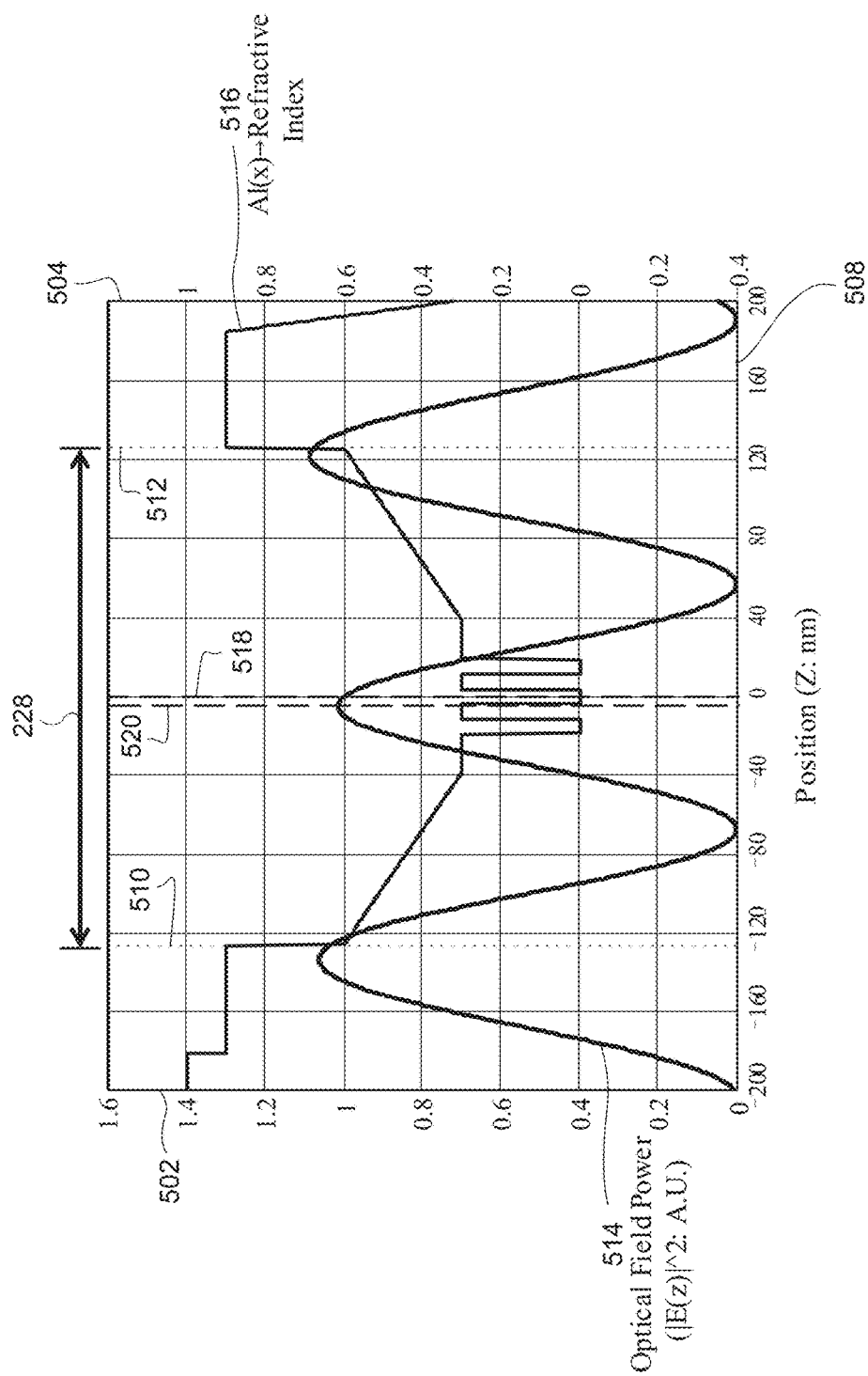
FIG. 5B illustrates electric field center and oxide node positions shown in relation to a center of multiple quantum wells in a semiconductor light-emitting element of type B, according to some embodiments.
Figure 5C:
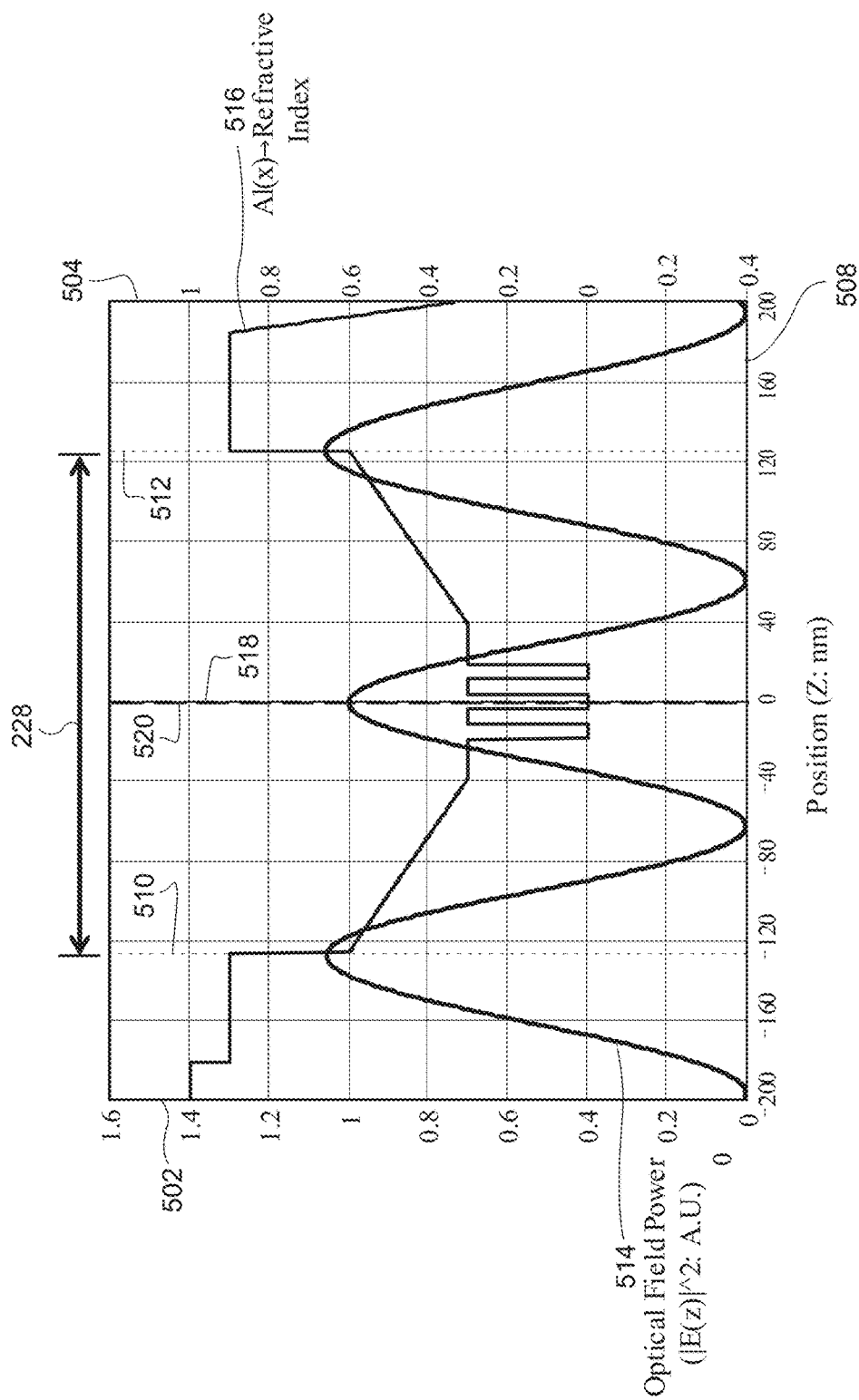
FIG. 5C illustrates electric field center and oxide node positions shown in relation to a center of multiple quantum wells in a semiconductor light-emitting element of type C, according to some embodiments.

FIGS. 5A-C illustrate the electric field center and the oxide node positions relative to each other in respective types—Type-A, Type-B, and Type-C—of surface-emitting semiconductor elements. In each of FIGS. 5A-C, the left vertical axis 502 represents the optical field power $(E(z)^2$: A.U.); the right vertical axis 504 represents the Al (x) molefraction dependent refractive index (RI); and the horizontal axis 508 represents positions in relation the center of the quantum wells, where distances are specified in nanometers. The center (i.e., 0 value) of the horizontal axis 508 represents the center of the multiple quantum wells, with the left of center representing the p-doped side of the light emitting laser and the right of center representing the n-doped side. The dashed lines 510 and 512 represent the ends of the VCSEL cavity region. The type-C surface-emitting semiconductor element corresponding to FIG. 5C may be a semiconductor element in accordance with an embodiment.

Each of FIGS. 5A-C illustrates an electric field 514, the aluminum content Al(x) 516 and the center position 518 of the quantum wells. The dashed line 520 represents a node of the electrical field. The dashed line 520 may correspond to dashed line 216 shown in FIG. 2. As shown in FIGS. 5A-B, the type-A and type-B are phase mismatched and do not have the corresponding electrical wave node such that it overlaps or nearly overlaps with the center quantum well. However, in the type-C, as shown in FIG. 5C, the corresponding electrical field node position overlaps with the center quantum well position. Consequently, in accordance with the illustrated waveform of the electric field, each end of the VCSEL cavity also overlaps with a node position of the electric field. Thus, whereas the type-A and type-B are phase-mismatched, the type-C is phase matched.

Figure 6A:
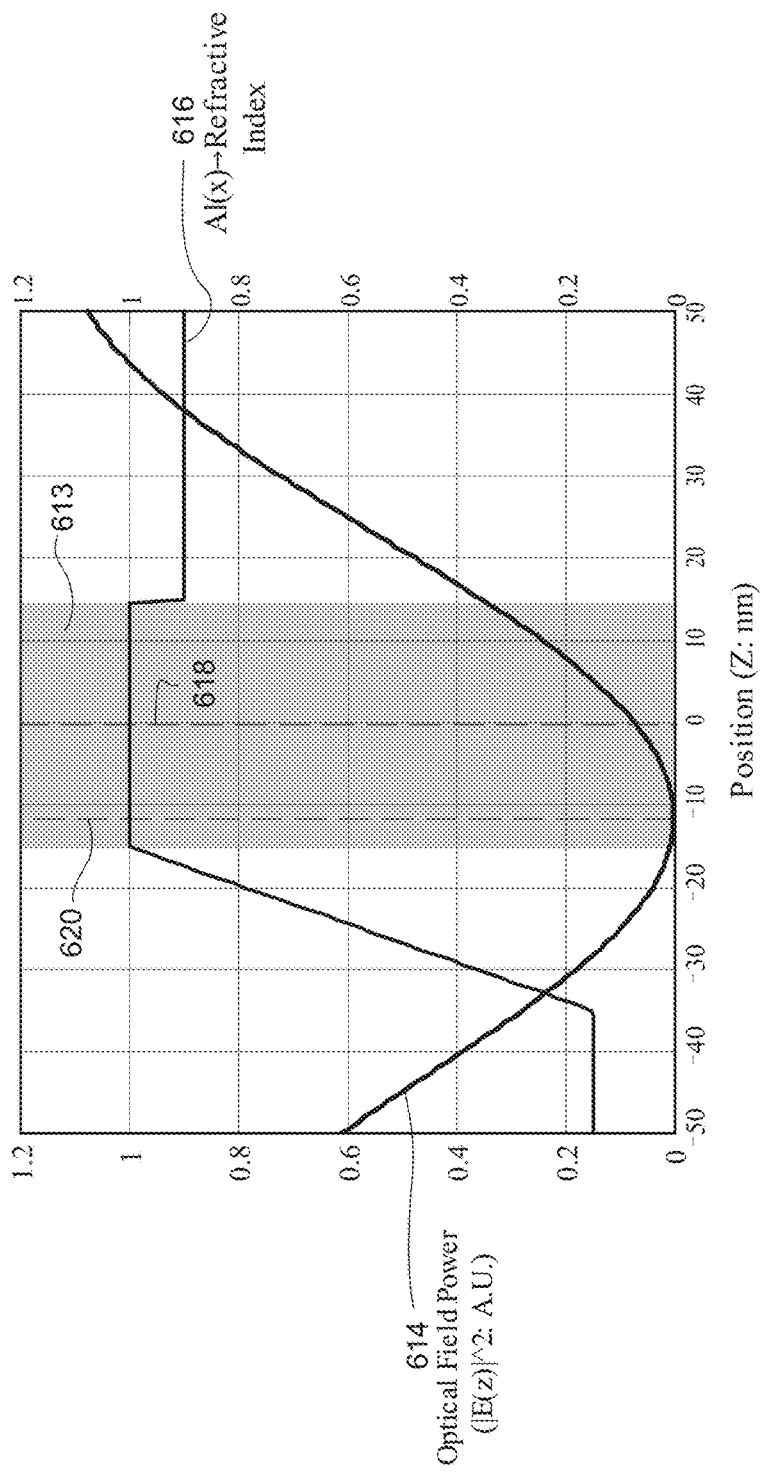
FIG. 6A illustrates electric field center and oxide node positions shown in relation to a center of the oxide layer in a semiconductor light-emitting element of type A, according to some embodiments.
Figure 6B:
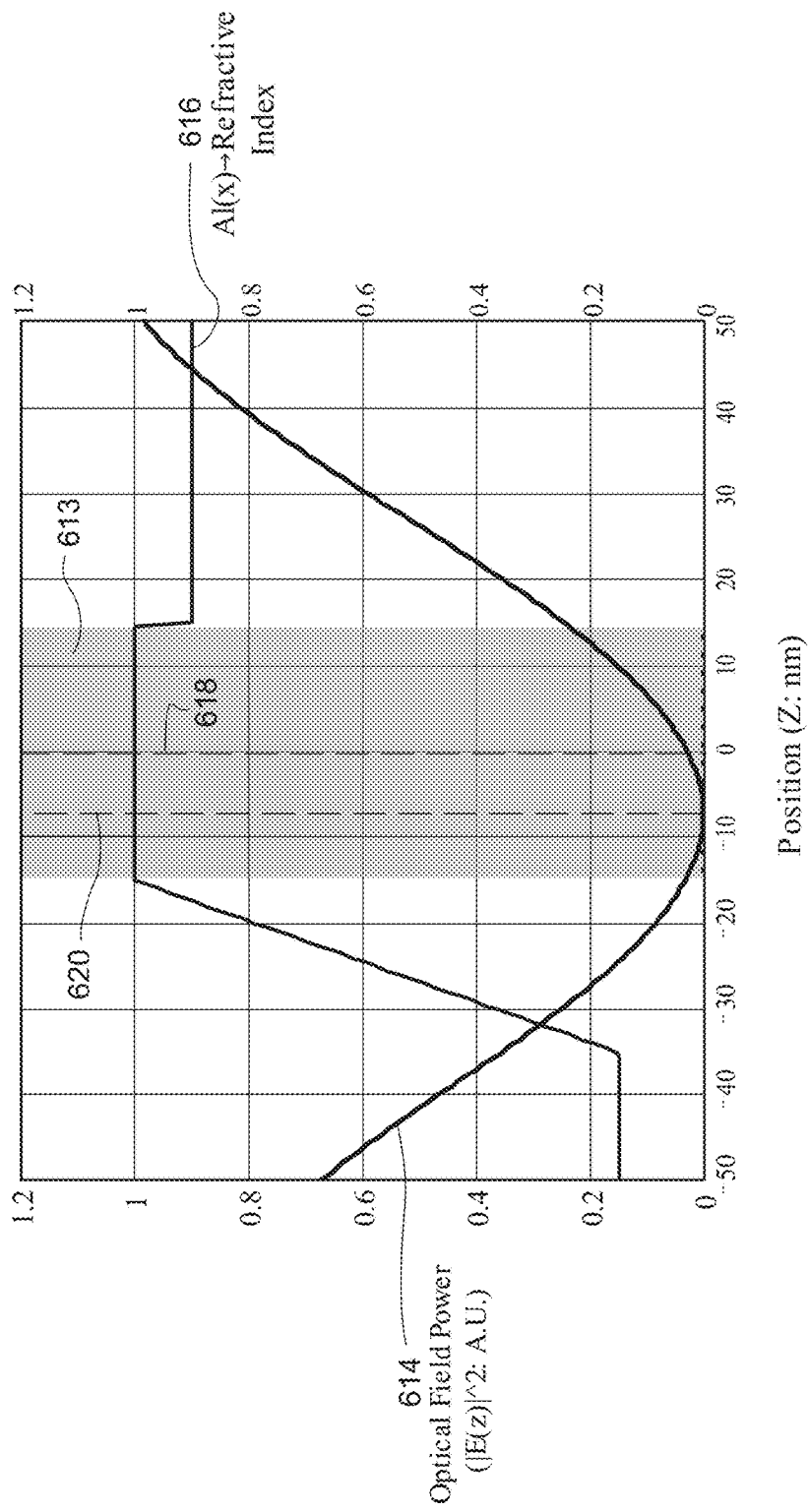
FIG. 6B illustrates electric field center and oxide node positions shown in relation to a center of the oxide layer in a semiconductor light-emitting element of type B, according to some embodiments.
Figure 6C:
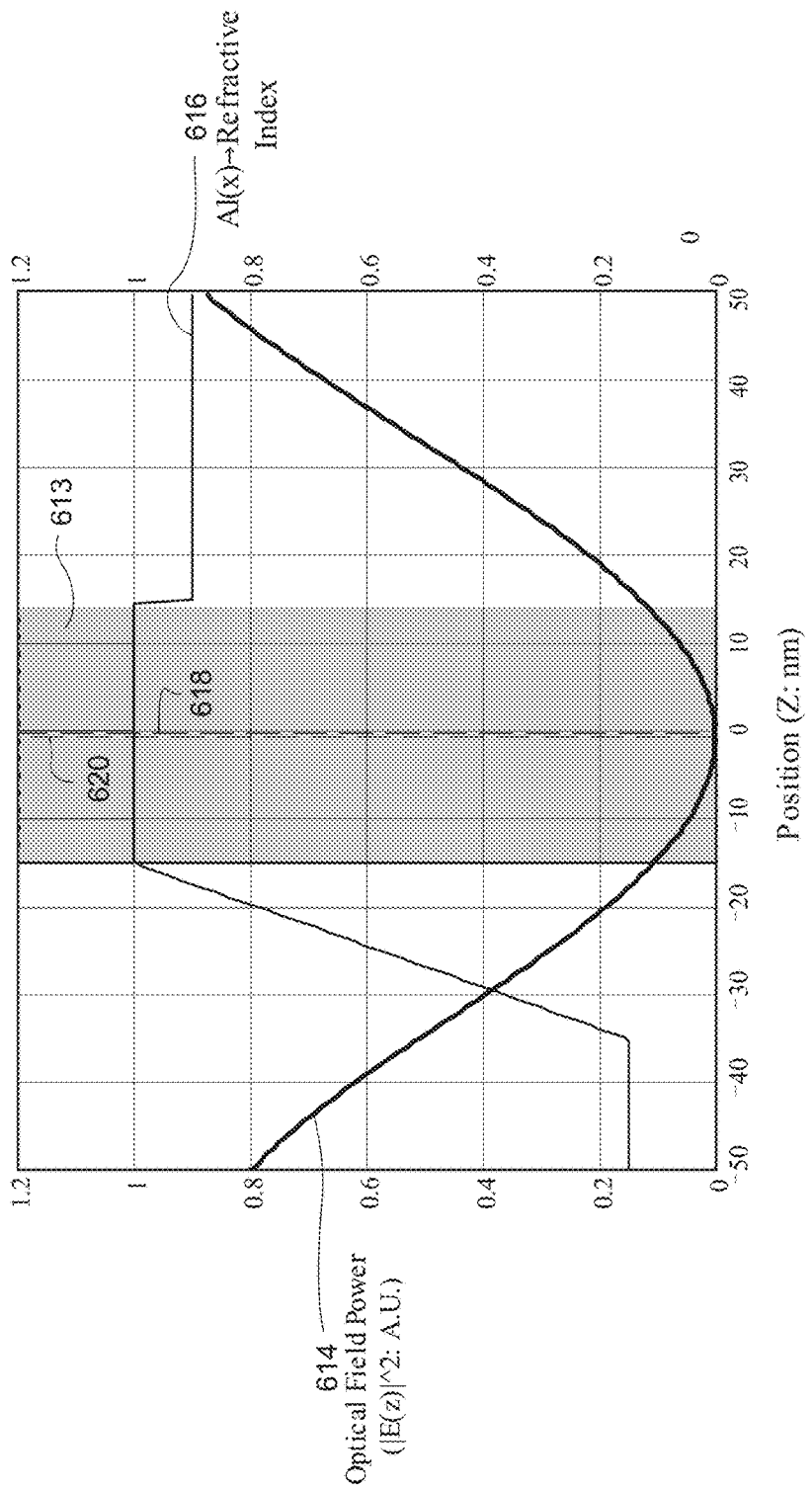
FIG. 6C illustrates electric field center and oxide node positions shown in relation to a center of the oxide layer in a semiconductor light-emitting element of type C, according to some embodiments.

FIGS. 6A-C illustrate another view of the electric field center and the oxide node positions relative to each other in the A, B, and C types. In each FIGS. 6A-C, the left vertical axis 602 represents the optical field power $(E(z)^2$:A.U.); the right vertical axis 604 represents the aluminum content (e.g., Al(x)); the horizontal axis 608 represents positions in relation the center of the oxide layer in nanometers. The center (i.e., 0 value) of the horizontal axis represents the center of the oxide layer, with the left of center representing the p-doped side of the light emitting laser and the right of center representing the undoped optical cavity.

Each of FIGS. 6A-C illustrates an electric field 614, the aluminum content 616, and the center position 618 of the oxide layer. As shown by the shaded region 613, the area in the light emitting laser corresponding to an aperture in the oxide layer has a higher aluminum content that the areas immediately adjacent. The dashed line 620 represents an antinode of the electrical field. As shown in FIGS. 6A-B, the Type-A and Type-B do not have the corresponding electrical wave antinode such that it overlaps with the center of the oxide layer. The difference between the standing wave and center of oxide layer in type-A is greater than the difference between the standing wave and center of oxide layer in type-B. However, in the type-C, as shown in FIG. 6C, the corresponding electrical field antinode position overlaps with the center of oxide layer. Based upon FIGS. 5A-C and 6A-C, in essence, whereas in the case of the type-C the difference between the standing wave and the center of multiple quantum wells (CMQW) is substantially 0, in the cases of type-A and type-B, the difference is greater than 0 with the type-A showing a greater difference than the type-B.

FIG. 7 illustrates, in a table 700, some of the results based upon FIGS. 4, 5A-C, and 6A-C. Columns 702, 704, and 706 represent the A, B, and C type surface-emitting lasers illustrated in 5A (and 6A), 5B (and 6B), and 5C (and 6C), respectively. Table 700 indicates an example phase-shift for upper (116) and lower layers (114) of the VCSEL cavity the magnitude of the mismatch between the electrical field node and the oxide layer center, the effective refractive index, a normalized frequency, and a lateral mode quantity for each of the types A, B and C.

As shown in table 700, the type C surface-emitting semiconductor element has the lowest refractive index $(\Delta N_{eff})$ between the types considered, for example, at 0.00493. The type-C also has the smallest magnitude in the mismatch between the electrical field node and the oxide layer center—expressed as a distance in nanometers at 0.76 or as a wave magnitude of 0.00268λ. Moreover, the type-C also displayed the lowest normalized frequency and lateral-mode quantity compared to the A and B types.

Figure 8:
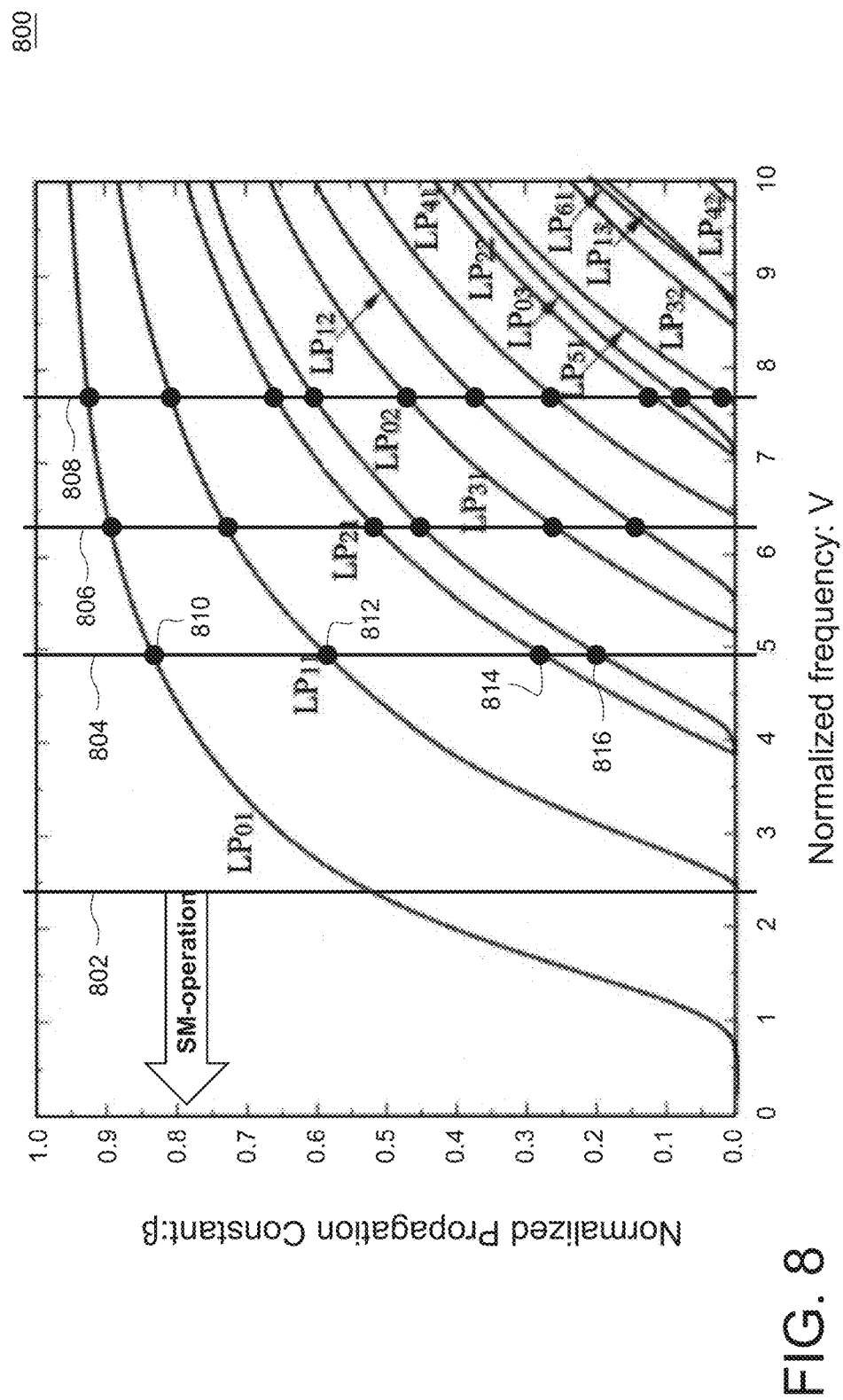
FIG. 8 schematically illustrates the relationship between a normalized propagation constant and a normalized frequency for the light-emitting elements of types A, B, and C, illustrated in FIGS. 5A-C and 6A-C.

FIG. 8 graphically illustrates the relationship between the normalized propagation constant ß, shown on the y-axis of graph 800, and normalized frequency V shown on the x-axis, in a cylindrical step-index waveguide. Graph 800 provides for estimating the lateral-mode quantity associated with each type of surface-emitting semiconductor element. As shown, single-mode operation requires values less than or equal to V corresponding to line 802. Lines 804, 806 and 808 represent the type-C at V=4.97, the type-B at V=6.27, and the type-A at V=7.71. As shown, the four modes corresponding 810, 812, 814, and 816 provided by the type-C light emitting laser, are fewer than the number of modes provided by the type-B and the type-A lasers, which provide six modes and ten modes, respectively.

FIG. 9 illustrates a table 900 showing example design parameters and corresponding experimental findings for surface-emitting semiconductor element of types A, B, and C, according to certain example embodiments. As shown in FIGS. 1 and 2, for each type of design A, B and C, the individual layers of sections 116 and 117 in FIG. 1 were chosen such that the net optical distance of 116, 115 and 114 in FIG. 2 (total optical distance of sections 1, 2, 3 shown in FIG. 2) is fixed at 1.75λ.

As shown in FIG. 9 table 900, experimentally determined beam divergence, beam quality, and the spectral RMS line width all provided lower, and therefore more desirable, values for the type-C of laser compared to the A and B types. For example, the beam divergence for the C type laser measured approximately 22 degrees plus/minus 3, the $M^2$ beam quality at fixed PMID of 8.25 um measured approximately 2.96, and the spectral RMS line width yielded 0.2-0.4 nm. In comparison, the type-A laser measured beam divergence approximately 35 degrees, $M^2$ beam quality approximately at 4.8, and spectral RMS line width at 0.6-0.8 nm, and the type-B laser measured beam divergence approximately 28 degrees, $M^2$ beam quality approximately at 3.59, and spectral RMS line width at 0.4-0.6 nm.

Thus, as shown by the experimental results in table 900, the $N_{eff}$ can be effectively tuned to make high quality lasers having narrow FFP and narrow RMS line width. For instance, certain example embodiments include VCSELs emitting in the wavelength range of 650-1300 nm by changing the physical thickness corresponding to the fixed optical thickness, as shown, for example, by changing in particular the size of the L4 oxide layer.

Figure 10:
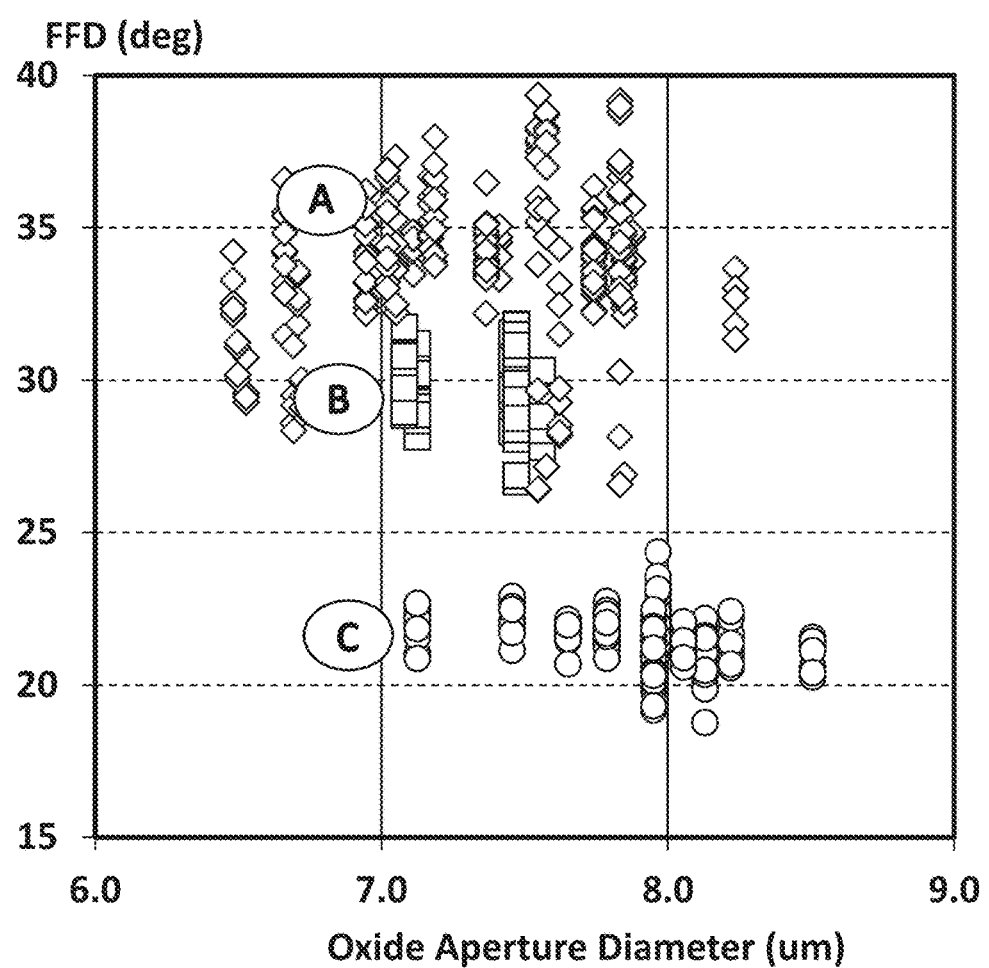
FIG. 10 illustrates experimentally observed beam divergence in certain VCSEL epi-wafer designs in Type-A to Type-C as a function of the diameter of the aperture in the oxide layer.

FIG. 10 graphically illustrates an experimentally observed relationship between the oxide layer aperture diameter and FFD for type-A, Type-Band Type-C in 850 nm VCSELs. Graph 1000 has the aperture diameter in um on the x-axis and FFD in degrees on the y-axis.

As can be seen, the FFD obtained for all measurements of the A and B types were well above any of the measurements of FFD obtained for the C type lasers. Consequently, Neff can be effectively tuned to make narrow FFP ("far field pattern") lasers.

Figure 11:
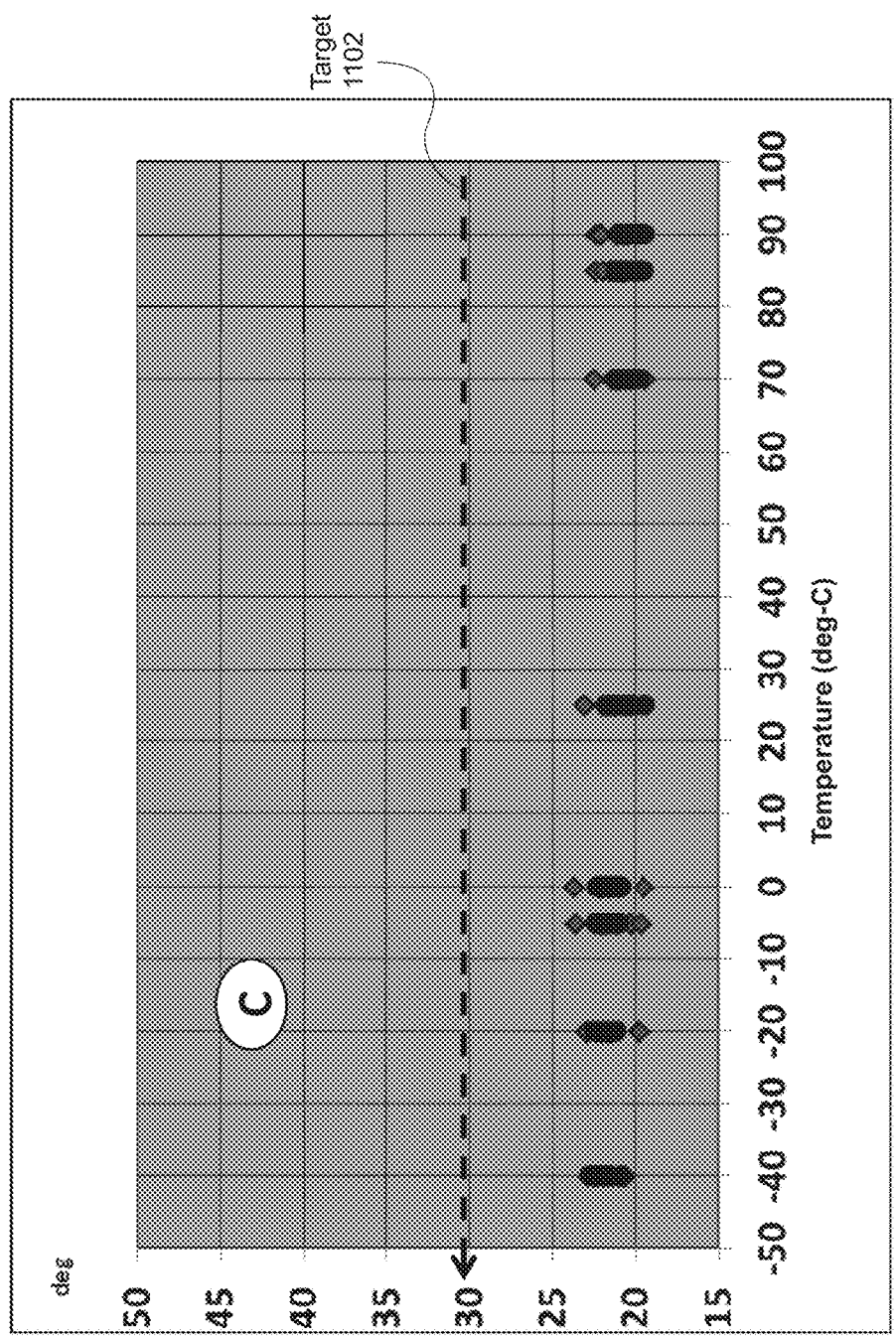
FIG. 11 illustrates experimentally observed beam divergence in Type-C VCSEL epi-wafers as a function of temperature.

FIG. 11 graphically illustrates that the FFD measured for type-C lasers at various temperatures between −40 degrees Celsius and 90 degrees Celsius under a constant current (6.0 mA) remains well below a target FFD 1102 of 30 degrees. The target 30 deg. or lower FFP is needed to have better coupling efficiency with optical fibers, which can be easily achieved from type-C laser design.

Figure 12A:
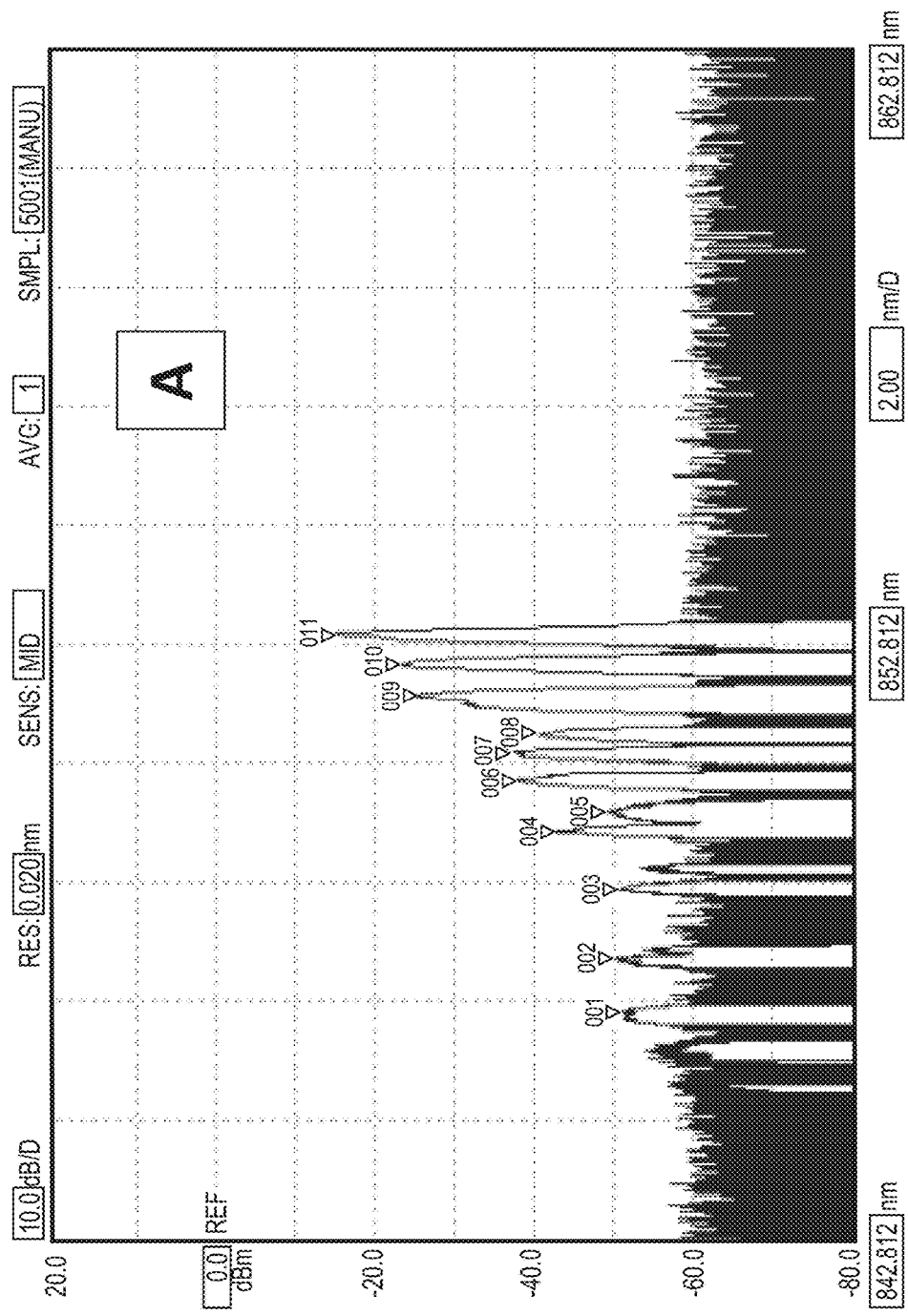
FIG. 12A illustrates experimentally observed lasing spectra in certain semiconductor light-emitting elements of type A such as those illustrated in FIGS. 5A and 6A.
Figure 12B:
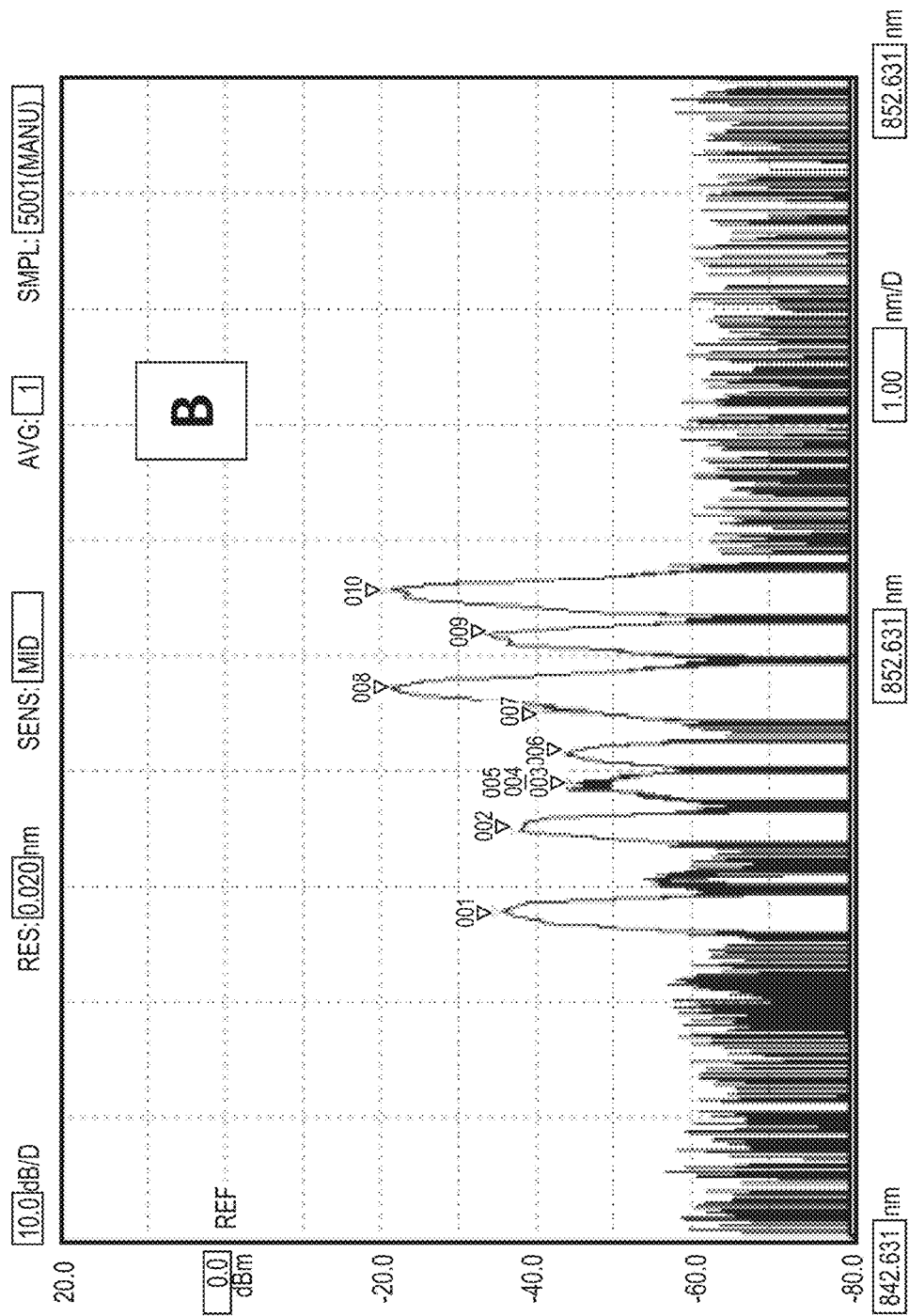
FIG. 12B illustrates experimentally observed lasing spectra in certain semiconductor light-emitting elements of type B such as those illustrated in FIGS. 5B and 6B.
Figure 12C:
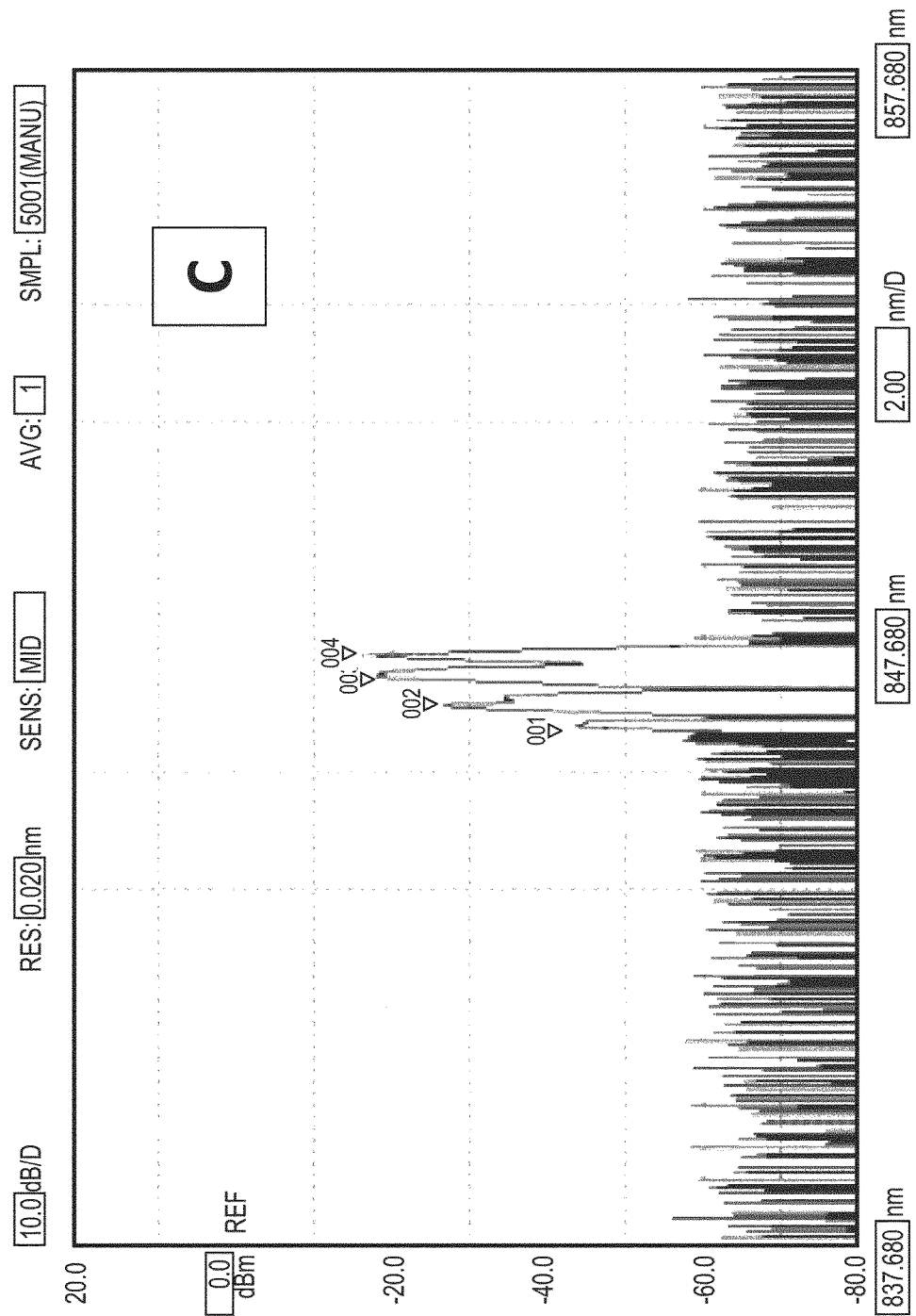
FIG. 12C illustrates experimentally observed lasing spectra in certain semiconductor light-emitting elements of type C such as those illustrated in FIGS. 5C and 6C.

FIGS. 12A-C illustrate experimentally observed lasing spectra for the type A laser (FIG. 12A), for the type-B laser (FIG. 12B), and for the type-C laser (FIG. 12C). As clearly visible in FIG. 12C, when compared with FIGS. 12A-B, for example, the type-C laser provides for lasing spectra with reduced mode quantities achieved using 0.04λ phase shift.

Figure 13:
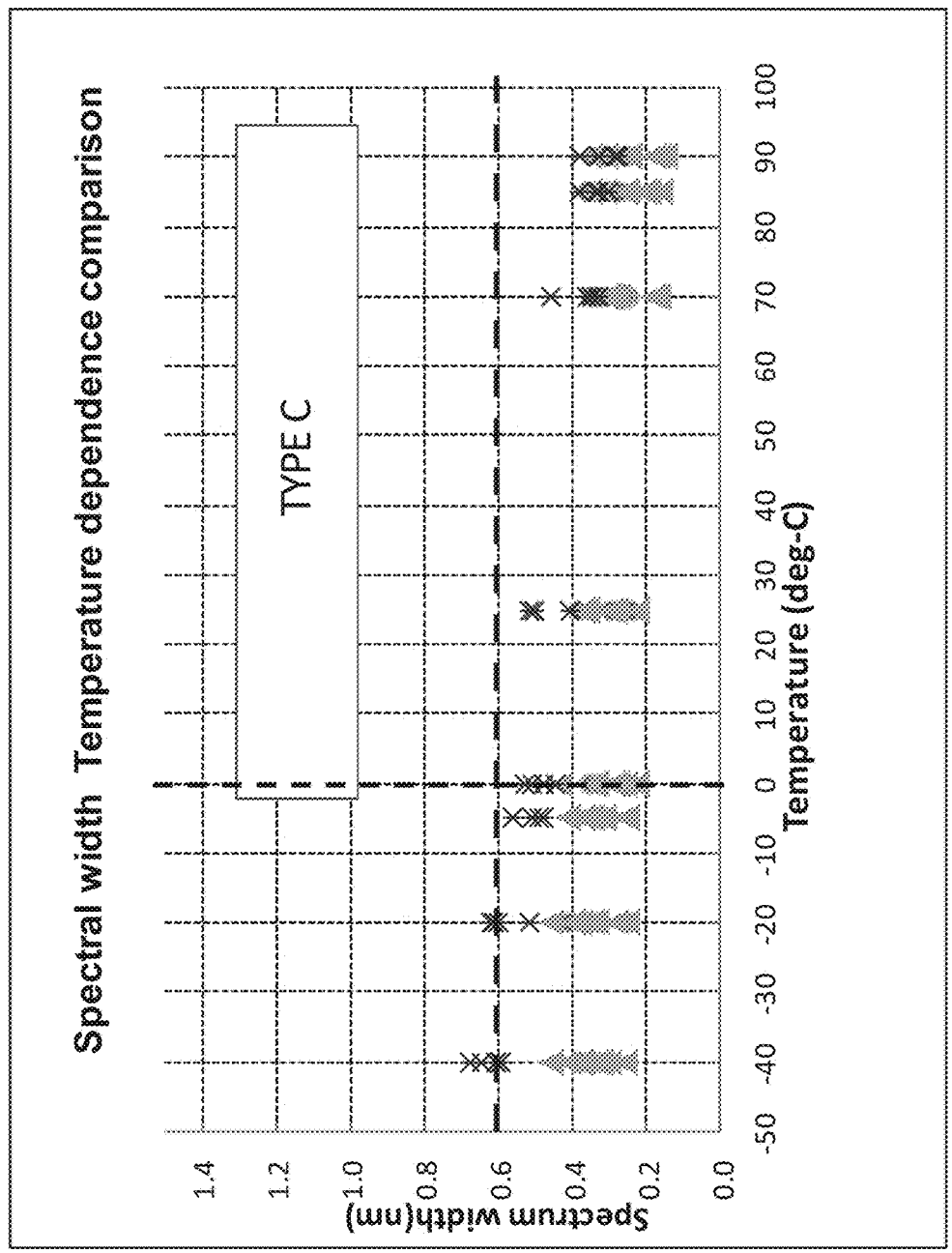
FIG. 13 illustrates experimentally observed line width in certain semiconductor light-emitting elements of type C as a function of temperature, such as those illustrated in FIGS. 5C and 6C.

FIG. 13 illustrate experimentally observed line width in processed 850 nm VCSEL epi-wafers for laser type-C. FIG. 13 illustrates that, for several lasers of the type-C, the spectral width spans values from over 0.6 nm (e.g., about 0.7 nm) to under 0.2 nm (e.g., about 0.1 nm). Thus, the clearly narrower spectrum width associated with FIG. 13 illustrates Neff can be effectively tuned to make narrow RMS LW lasers.

Figure 14:
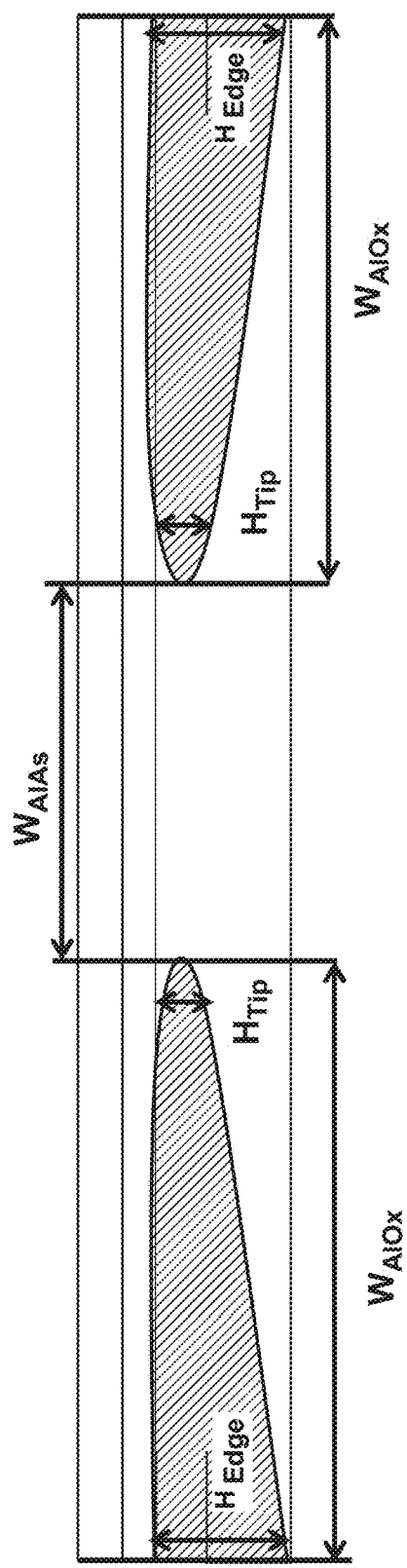
FIG. 14 schematically illustrates the size relationships in the oxide layer according to certain example embodiments.

FIG. 14 provides a schematic illustration of an oxide layer and the aperture such as, for example, the oxide layer 122 and aperture 123 shown in FIG. 1. According to certain embodiments, the aperture provides an opening of length $W_{AlAs}$, having oxide layers of length $W_{AlOx}$, on either side of the aperture. The length of the oxide layer and the aperture is configured such that they satisfy the relationship:

$$W_{AlAs} \leq W_{AlOx}$$

The oxide layer is configured such that, according to certain example embodiments, the ratio of the height $H_{Edge}$ of the oxide layer at the edge to the height $H_{tip}$ of the oxide layers closest to the aperture satisfies the relationship:

$$H_{Edge} \leq 3 \times H_{tip}$$

The $M^2$ beam quality factor can be defined as:

$$M^2 = \left(\frac{\pi D}{2\lambda}\right)\tan\left(\frac{\theta}{2}\right)$$

Figure 15:
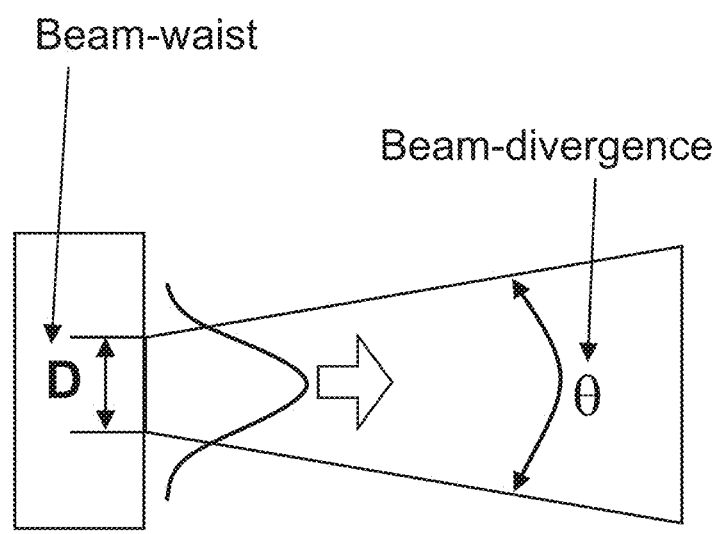
FIG. 15 illustrates the dependence of beam quality factor in relation to the divergence angle for certain example embodiments.

D is the beam waist and theta is the beam divergence, which are illustrated in FIG. 15. FIG. 15 illustrates that for a fixed value of p-metal inner diameter (PMID) and to get high beam quality, lower FFP values are needed, which can be achieved from fine tuning of optical phase shifts among layers 116, 115, & 114 shown in FIG. 2. Type-C laser designs offer high beam quality through lower FFP values in comparison to type A and type B designs.

Figure 16:
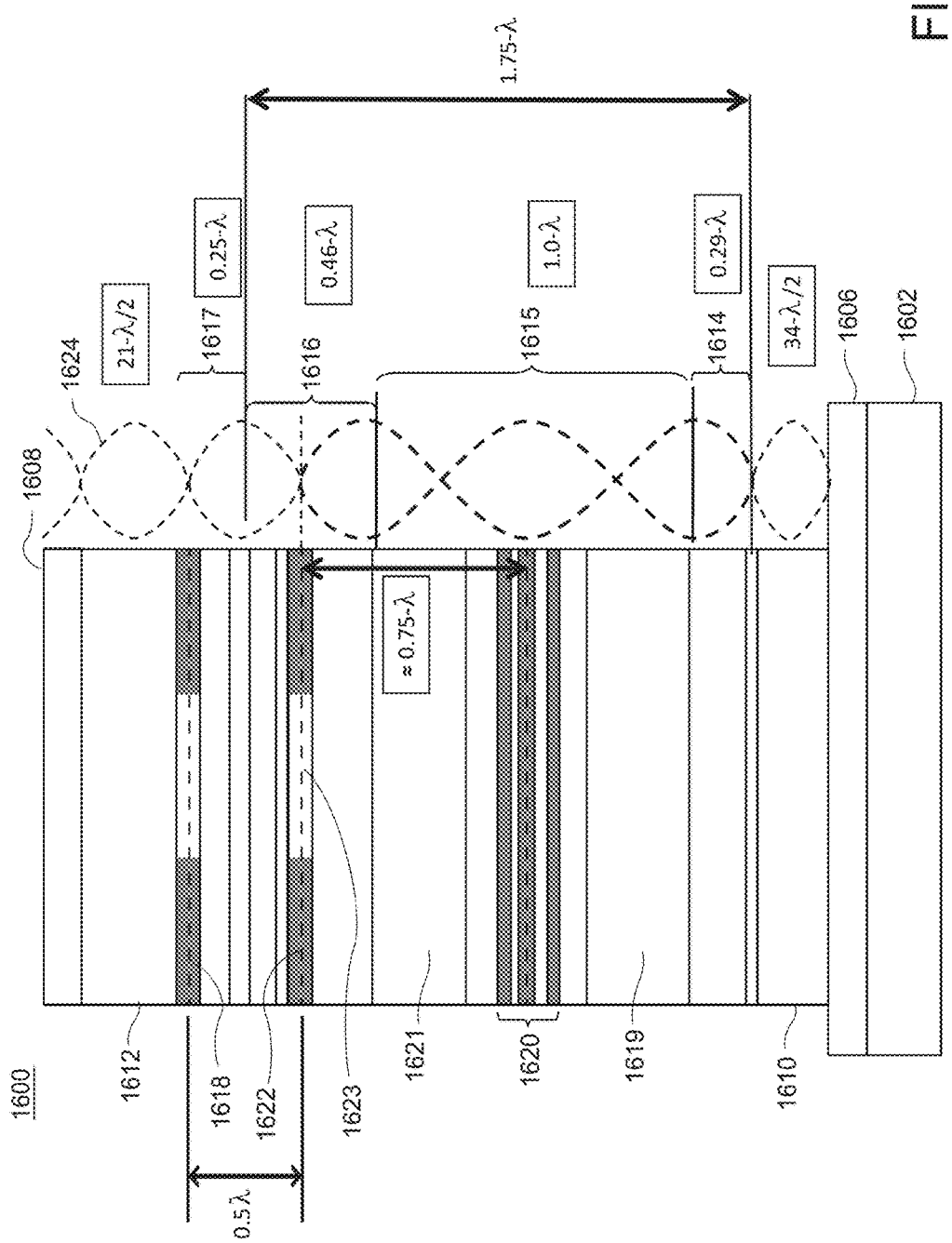
FIG. 16 illustrates electric field center and oxide node positions in the case of dual oxide layers in relation to a center of multiple quantum wells in a semiconductor light-emitting element.

In the case of dual oxide layers positioned in top DBR with Al(x=0.98 or higher), the optical distance between these two oxide layers is set to be at 0.5λ, causing the center of the two oxide layers to exactly match with nodes of standing wave electric fields. FIG. 16 illustrates a schematic cross-sectional view of the structure of a surface-emitting semiconductor element 1600 with dual oxide layers 1618 and 1622 positioned in top DBR at an optical distance of 0.5? from each other, according to some embodiments. Layers 1602, 1606, 1608, 1610, 1612, 1614, 1615, 1616, 1617, 1619, 1620, 1621 and 1622 correspond respectively to layers 102, 106, 108, 110, 112, 114, 115, 116, 117, 119, 120, 121 and 122 shown in FIG. 1. However, in contrast to the semiconductor element 100, semiconductor element 1600 at layers 1617 includes a second oxide layer 1618. FIG. 16 also illustrates the electrical standing wave 1624 for surface-emitting semiconductor element 1600.

Figure 17:
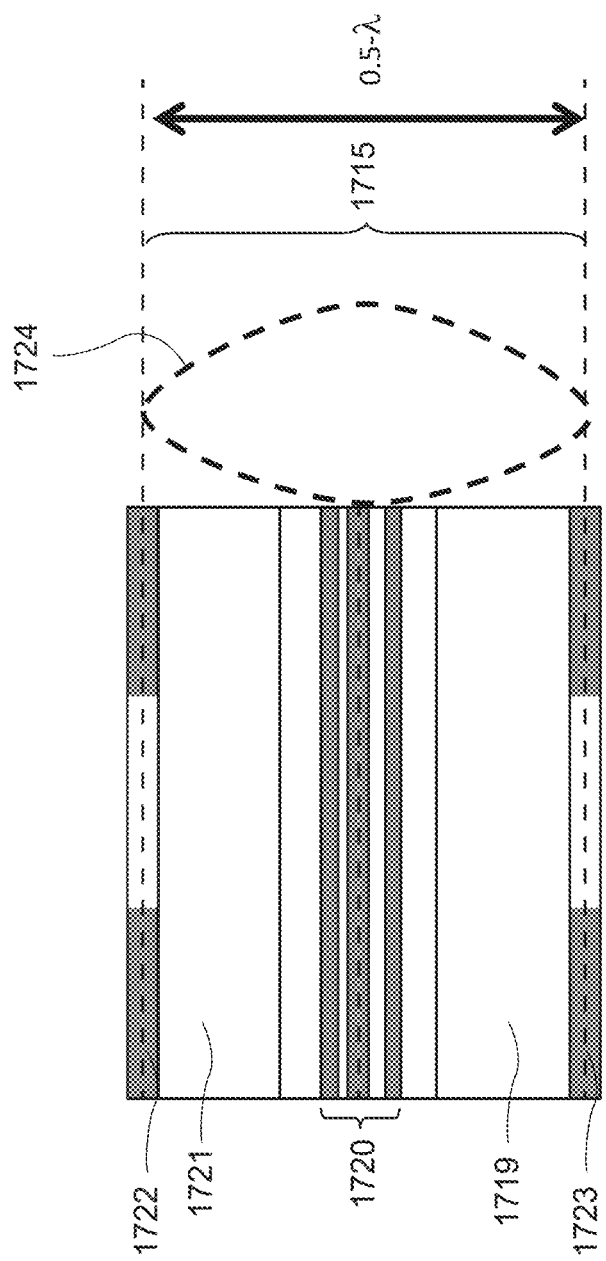
FIG. 17 illustrates the shortest optical cavity and dual oxide layers are arranged one above and one below multiple quantum well gain layers, according to some embodiments. In this case the optical distance between electric field center at the center of multi quantum wells and oxide node positions defines the shortest possible optical cavity in a semiconductor light-emitting element.

In some embodiments, the graded spacer layer(s) can be adjusted such that the optical cavity is at its shortest optical cavity length of 0.5λ. In this case too, the dual oxide layers with Al(x=0.98 or higher) are positioned one above and one below multiple quantum well gain region such that, the optical distance between these two oxide layers is at 0.5λ, causing the center of the two oxide layers to exactly match with nodes of standing wave electric field. FIG. 17 schematically illustrates oxide layers 1722 and 1723 located above and below the light emitting layer 1720 in the optical cavity 1715. The distance between layers 1722 and 1723 is set to be 0.5λ. In the illustrated embodiment, a node of the standing wave 1724 is located at the midpoint of the optical cavity 1715. Layers 1719 and 1721 may correspond to layers 119 and 121 shown in FIG. 1. In this case the optical distance between electric field center at the center of multi quantum wells and oxide node positions defines the shortest possible optical cavity in a semiconductor light-emitting element.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A surface-emitting laser, comprising:
   a top mirror and a bottom mirror, each made with multilayers of semiconductor thin films with alternative indices of refraction;
   at least one oxide section, formed between the top and bottom mirrors, comprising a stacked plurality of layers of semiconductor thin film of which at least one semiconductor thin film layer is provided as an oxide layer having an aluminum content of at least 98%;
   a light emitting cavity region, formed between the oxide section and the bottom mirror, having a plurality of quantum wells and a plurality of barrier layers formed from semiconductor thin film with the quantum wells including $In_xGaAs$ where x=0-1 and the barriers including either $Al_xGaAs$ barriers where x=0-0.4 or $GaAs_{1-y}P_y$ where y=0.2-0.3; and
   a phase matching section with a graded index layer made of semiconductor thin films;
   wherein a total length of the oxide section, the light emitting cavity region and the phase matching section is 1.75 times an emitting wavelength,
   wherein the distance from center of the quantum wells to the center of the oxide layer is 0.75 times the emitting wavelength,
   wherein layers of the oxide section and the phase matching section are adjusted such that the 1/e2 width of beam divergence value is between 15-26 degrees, and such that the spectral RMS line width value be less than 0.45 nm,
   wherein a layer in the oxide section above the oxide layer is a graded composition layer with high aluminum content above 98% and a thin layer in the oxide section below the oxide layer includes $Al_{0.9}GaAs$,
   wherein the oxide layer include high aluminum content above 98% and is p-doped at $2.5\times10^{18}$ cm$^{-3}$, and
   wherein the bottom mirror includes alternating refractive index layers made from $Al_xGaAs$ where x=0.12 & 0.9-1 for 850 nm wavelength and with x=0 & 1 for 1060 nm wavelength.

2. The surface-emitting laser according to claim 1, wherein $H_{Edge}$ is a height of the oxide layer at an edge furthest from an aperture in the oxide layer, and $H_{tip}$ is a height of the oxide layer closest to the aperture such that $H_{Edge} \leq 3 \times H_{tip}$.

3. The surface-emitting laser according to claim 1, wherein an aperture in the oxide layer provides an opening of length $W_{AlAs}$, and the oxide layer extends for a length $W_{AlOx}$ on either side of the aperture such that $W_{AlAs} \leq W_{AlOx}$.

4. The surface-emitting laser according to claim 1, wherein a substrate of the surface-emitting laser comprises n-doped, p-doped, or un-doped GaAs.

5. The surface-emitting laser according to claim 4, wherein the substrate is oriented 2 degrees-off axis along a selected plane.

6. The surface-emitting laser according to claim 1, wherein in the layer above the at least one oxide layer in the oxide section, a linear grading is used for the aluminum content Al(x), wherein x ranges from 1.0 to 0.15 from start to end of the layer.

7. The surface-emitting laser according to claim 1, the top mirror is either linearly doped or modulation doped.

8. The surface-emitting laser according to claim 1, wherein a top contact layer comprising p$^{++}$ GaAs is provided above and adjacent to the top mirror, and wherein the top contact layer is terminated either as in-phase or anti-phase and includes a surface relief structure to control photon lifetime for achieving higher bandwidths.

9. The surface-emitting laser according to claim 1, wherein the top mirror includes three to four $Al_xGaAs$ layers with aluminum content at 96%.

10. The surface-emitting laser according to claim 1, wherein the at least one oxide section comprises a first oxide layer and a second oxide layer, both having aluminum content at 98% or greater, at an optical distance of 0.5λ from each other.

11. The surface-emitting laser according to claim 1, wherein a first oxide layer and a second oxide layer are located above and below, respectively, of the multiple quantum well gain region, and wherein a graded spacer layer is adjusted such that the optical cavity is at its shortest cavity length of 0.5λ.

12. A method for forming, using an epitaxial process, a surface-emitting laser, the method comprising:
   providing a top mirror and a bottom mirror, each made with multilayers of semiconductor thin films with alternative indices of refraction;
   providing at least one oxide section, formed between the top and bottom mirrors, comprising a stacked plurality of layers of semiconductor thin film of which at least one semiconductor thin film layer is provided as an oxide layer having an aluminum content of at least 98%;
   providing a light emitting cavity region, formed between the oxide section and the bottom mirror, having a plurality of quantum wells and a plurality of barrier layers formed from semiconductor thin film with the quantum wells including $In_xGaAs$ where x=0-1 and the barriers including either $Al_xGaAs$ barriers where x=0-0.4 or $GaAs_{1-y}P_y$ where y=0.2-0.3; and
   providing a phase matching section with a graded index layer made of semiconductor thin films;
   wherein a total length of the oxide section, the light emitting cavity region and the phase matching section is 1.75 times an emitting wavelength,
   wherein the distance from center of the quantum wells to the center of the oxide layer is 0.75 times the emitting wavelength,
   wherein layers of the oxide section and the phase matching section are adjusted such that the 1/e2 width of beam divergence value is between 15-26 degrees, and such that the spectral RMS line width value be less than 0.45 nm, wherein a layer in the oxide section above the oxide layer is a graded composition layer with high aluminum content above 98% and a thin layer in the oxide section below the oxide layer includes $Al_{0.9}GaAs$, wherein the oxide layer include high aluminum content above 98% and is p-doped at $2.5 \times 10^{18}$ $cm^{-3}$, and wherein the bottom mirror includes alternating refractive index layers made from $Al_xGaAs$ where x=0.12 & 0.9-1 for 850 nm wavelength and with x=0 & 1 for 1060 nm wavelength.

13. A surface-emitting laser, comprising:
a top mirror and a bottom mirror, each comprising a stacked plurality of layers of semiconductor thin film having alternating indices of refraction;
at least one oxide section, formed between the top and bottom mirrors, comprising a stacked plurality of layers of semiconductor thin film of which at least one semiconductor thin film layer is provided as an oxide layer having a high aluminum content;
a light emitting cavity region, formed between the oxide section and the bottom mirror, having a plurality of quantum wells and a plurality of barrier layers formed from semiconductor thin film; and
at least one phase matching section having a graded index layer of semiconductor thin film,
wherein a composition and a dimension of one or more of the oxide section, the light emitting cavity region, and the at least one phase matching section define a phase relationship and reduce an effective refractive index difference between core and clad of the surface emitting laser.

14. The surface-emitting laser according to claim 13, wherein the total length from the top end of the oxide layer to the bottom end of the phase matching layer is determined so as to correspond to a first value equal to an emitting wavelength multiplied by a first constant, and the total length of the light emitting region is determined so as to correspond to a second value equal to the emitting wavelength multiplied by a second constant.

15. The surface-emitting laser according to claim 14, wherein the first constant is 1.75 and the second constant is 1.0.

16. The surface-emitting laser according to claim 15, wherein the distance between the center of the plurality of quantum wells to a center of the oxide layer is substantially equal to 0.75 times the emitting wavelength.

17. The surface-emitting laser according to claim 16, wherein the oxide section and the at least one phase matching section are adjusted such that the $1/e^2$ width of beam divergence value is between 15-26 degrees.

18. The surface-emitting laser according to claim 17, wherein the oxide section and the at least one phase matching section are determined such that a corresponding spectral RMS line width value is less than 0.45 nm.

19. The surface-emitting laser according to claim 18, further comprising a graded composition layer above the oxide layer and a thin layer of $Al_{0.9}GaAs$ below the oxide layer.

20. The surface-emitting laser according to claim 19, the oxide layer is p-doped at $2.5 \times 10^{18}$ $cm^{-3}$.

21. The surface-emitting laser according to claim 20, wherein the light emitting cavity region includes three $In_xGaAs$ quantum wells where x=0, or five $In_xGaAs$ quantum wells where x=0.05-0.3 at between 850-1060 nm emission wavelength.

22. The surface-emitting laser according to claim 21, wherein the bottom mirror comprises alternating refractive index layers including $Al_xGaAs$ where x=0.12 and 0.9-1 for 850 nm emitting wavelength or with x=0 and 1 for 1060 nm emitting wavelength.

* * * * *